(12) United States Patent
Nazarian et al.

(10) Patent No.: US 10,453,896 B1
(45) Date of Patent: Oct. 22, 2019

(54) 4F2 RESISTIVE NON-VOLATILE MEMORY FORMED IN A NAND ARCHITECTURE

(71) Applicant: Crossbar, Inc., Santa Clara, CA (US)

(72) Inventors: Hagop Nazarian, San Jose, CA (US); Harry Yue Gee, Santa Clara, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 15/799,261

(22) Filed: Oct. 31, 2017

Related U.S. Application Data

(60) Provisional application No. 62/415,150, filed on Oct. 31, 2016.

(51) Int. Cl.
*H01L 27/24* (2006.01)
*H01L 45/00* (2006.01)
*G11C 13/00* (2006.01)

(52) U.S. Cl.
CPC ...... *H01L 27/2481* (2013.01); *G11C 13/0069* (2013.01); *H01L 27/2472* (2013.01); *H01L 45/085* (2013.01); *H01L 45/1233* (2013.01); *H01L 45/1266* (2013.01); *H01L 45/148* (2013.01); *H01L 45/1616* (2013.01); *H01L 45/1675* (2013.01)

(58) Field of Classification Search
CPC ............... H01L 45/148; H01L 45/1233; H01L 45/1675; H01L 45/1616; H01L 45/1266; H01L 45/085; H01L 27/2481; H01L 27/2472; G11C 13/0069
See application file for complete search history.

(56) References Cited

U.S. PATENT DOCUMENTS

| | | | |
|---|---|---|---|
| 2012/0044742 A1* | 2/2012 | Narayanan | G11C 8/10 365/148 |
| 2012/0287697 A1* | 11/2012 | Hanzawa | G11C 13/0004 365/148 |
| 2016/0190208 A1* | 6/2016 | Nazarian | G11C 13/003 257/5 |

* cited by examiner

*Primary Examiner* — David Lam
(74) *Attorney, Agent, or Firm* — Wegman, Hessler & Vanderburg/Crossbar

(57) ABSTRACT

A logical NAND memory architecture comprising two-terminal, non-volatile resistive memory is disclosed. By way of example, disclosed logical NAND architectures can comprise non-volatile memory cells having approximately $4F^2$ area. This facilitates very high memory densities, even for advanced technology nodes. Further, the disclosed architectures are CMOS compatible, and can be constructed among back-end-of-line (BEOL) metal layers of an integrated chip. In some embodiments, subsets of two-terminal memory cells in a NAND array can be constructed between different pairs of BEOL metal layers. In other embodiments, the two-terminal memory cells can be constructed between a single pair of BEOL metal layers.

20 Claims, 24 Drawing Sheets

4F2 RESISTIVE NON-VOLATILE MEMORY FORMED IN A NAND ARCHITECTURE

CROSS-REFERENCE TO RELATED APPLICATION

The present application for patent claims the benefit of and priority to U.S. Provisional Patent Application No. 62/415,150 filed Oct. 31, 2016 and entitled "4F² RESISITVE NON-VOLATILE MEMORY FORMED IN A NAND ARCHITECTURE", which is hereby incorporated by reference herein in its entirety and for all purposes.

INCORPORATION BY REFERENCE

The following are hereby incorporated by reference herein in their respective entireties and for all purposes: U.S. application Ser. No. 11/875,541 filed Oct. 19, 2007, and U.S. application Ser. No. 12/575,921 filed Oct. 8, 2009.

TECHNICAL FIELD

This disclosure relates generally to electronic memory, for example, the disclosure describes a resistive switching device configured according to a NAND logical arrangement and having cell area as small as 4F².

BACKGROUND

A recent innovation within the field of integrated circuit technology is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

Resistive random access memory (RRAM) is one example of resistive memory. The inventors of the present disclosure believe RRAM has the potential to be a high density non-volatile information storage technology. Generally, RRAM stores information by controllably switching among distinct resistive states. A single resistive memory can store a single bit of information, or multiple bits, and can be configured as a one-time programmable cell, or a programmable and erasable device, as various memory models demonstrated by the assignee provide.

Various theories have been proposed by the inventors to explain the phenomenon of resistive switching. In one such theory, resistive switching is a result of formation of a conductive structure within an otherwise electrically insulating medium. The conductive structure could be formed from ions, atoms that can be ionized under appropriate circumstances (e.g., a suitable electric field), or other charge carrying mechanisms. In other such theories, field-assisted diffusion of atoms can occur in response to a suitable electric potential applied to a resistive memory cell. In still other theories proposed by the inventors, formation of the conductive filament can occur in response to joule heating and electrochemical processes in binary oxides (e.g., $NiO$, $TiO_2$, or the like), or by a redox process for ionic conductors including oxides, chalcogenides, polymers, and so on.

The inventors expect resistive devices based on an electrode, insulator, electrode model to exhibit good endurance and life cycle. Further, the inventors expect such devices to have high on-chip densities. Accordingly, resistive elements may be viable alternatives to metal-oxide semiconductor (MOS) transistors employed for digital information storage. The inventors of the subject patent application, for instance, believe that models of resistive-switching memory devices provide some potential technical advantages over non-volatile Flash MOS devices.

In light of the above, the inventors endeavor to make further improvements in memory technology, and resistive memory.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In some disclosed embodiments, there is provided a logical NAND memory architecture for two-terminal resistive switching memory. The logical NAND architecture (also referred to as a NAND array in the present disclosure) can comprise an array of multiple memory cells, such as an 8-cell array or other suitable sized array. In various embodiments, individual memory cells of the array can comprise memory cells having one transistor in parallel with one resistive memory device. Further, respective memory cells of disclosed memory architectures can be formed consuming an area as small as 4F², providing great scaling potential with the emergence of advanced lithographic technologies (e.g., below 28 nm resolution). In some embodiments, two-terminal resistive switching memory can be formed from a vertical or substantially vertical stack of components overlying a substrate. In at least some such embodiments, adjacent memory cells can be formed in different back-end-of-line (BEOL) layers of an integrated circuit. In other embodiments, two-terminal resistive switching memory can be formed from a horizontal or substantially horizontal stack of components. In the latter embodiments, adjacent memory cells can be formed in a common BEOL layer(s), permitting other devices or other memory cells to be formed in other BEOL layers at least in part above or below the adjacent memory cells.

In an embodiment, there is disclosed a method for fabricating a memory device. The method can comprise providing a substrate having a set of transistors formed therein, and forming a set of metal lines in a layer over the substrate. Further, the method can comprise forming a two-terminal switching device in a second layer over the first layer and connected at a first terminal to one of the set of metal lines, and forming a set of second metal lines in a third layer over the second layer, wherein one of the second metal lines is connected to a second terminal of the two-terminal switching device. Further to the above, the method can comprise forming a second two-terminal switching device in a fourth layer over the third layer and at least in part offset about 1F distance from the two-terminal switching device, and wherein the second two-terminal switching device is connected at one end to the one of the second metal lines. Moreover, the method can comprise forming a set of third metal lines in a fifth layer over the fourth layer, with one of the third metal lines connected at a second end of the second two-terminal switching device.

In additional embodiments, there is provided a method of fabricating a memory device. The method can comprise forming a set of bottom electrodes in a back-end-of-line (BEOL) layer of an integrated circuit device, at least in part overlying one or more transistors. The method can further comprise forming a switching layer in electrical contact with a bottom electrode of the set of bottom electrodes, wherein the switching layer is at least in part within the BEOL layer of the integrated circuit device. Furthermore, the method can comprise forming a top electrode in electrical contact with the switching layer and at least in part within the BEOL layer, wherein the bottom electrode, the switching layer and the top electrode form a memory cell having a width approximately equal to two times a minimum feature size employed for the integrated circuit device.

Further embodiments provide a resistive memory array formed in a logical NAND arrangement. The resistive memory array can comprise a set of multiple resistive switching memory cells connected respectively in series from respective first terminals to respective second terminals. Further, respective memory cells of the set of multiple resistive switching memory cells can be connected in parallel with a transistor of a set of transistors, forming a parallel 1T1R arrangement for each memory cell. In addition to the foregoing, a projected distance onto a substrate surface between adjacent memory cells of the set of multiple resistive switching memory cells can be about two times a minimum feature size of fabrication employed to form the set of multiple resistive switching memory cells.

In yet another embodiment, the present disclosure provides a memory array comprising two-terminal resistive switching memory. The memory array can comprise multiple two-terminal resistive switching memory cells formed at least in part in a common BEOL layer of an integrated circuit, and a set of transistors formed within a substrate, wherein transistors of the set of transistors are respectively connected electrically in parallel to memory cells of the multiple two-terminal resistive switching memory cells. Further, a distance between a first of the multiple two-terminal resistive switching memory cells and a second of the two-terminal resistive switching memory cells is no greater than about two times a minimum feature size of the integrated circuit. Moreover, the multiple two-terminal resistive switching memory cells can be formed from a layer of materials stacked in a direction that is non-perpendicular to a top surface of the substrate.

In one or more additional embodiments, disclosed is a method for fabricating an array of memory devices. The method can comprise providing a substrate having an array of buried wordline transistors formed in the substrate, and having a dielectric layer formed over the substrate, wherein the transistor is a member of the array of buried wordline transistors and forming trenches through the dielectric layer exposing source and drain terminals of the transistors. Further, the method can comprise filling the trenches with conductive material to form bottom electrodes that electrically contact source or drain terminals of the transistors, etching back and smoothing a top surface of the conductive material and dielectric layer and forming a hardmask over the top surface of the conductive material and dielectric layer. Moreover, the method can comprise forming a second dielectric over the hardmask and etching second trenches through the second dielectric offset from the trenches, forming a switching layer over exposed surfaces of the second trenches and depositing second conductive material over the switching layer and filling the second trenches with the second conductive material. Further, the method can comprise removing second conductive material and second dielectric material to expose the hardmask to form top electrodes within the second trenches, forming a third dielectric over the bottom electrode, switching layer and top electrodes, forming third trenches in the third dielectric and filling the third trenches with a fourth conductive material. In addition to the foregoing, the method can comprise smoothing a top surface of the fourth conductive material and the third dielectric to form conductive contacts within the third trenches, forming vertical contacts connected respectively at a first end and a second end of the array of transistors and forming a first metal line connected to a first of the vertical contacts and a second metal line connected to a second of the vertical contacts.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
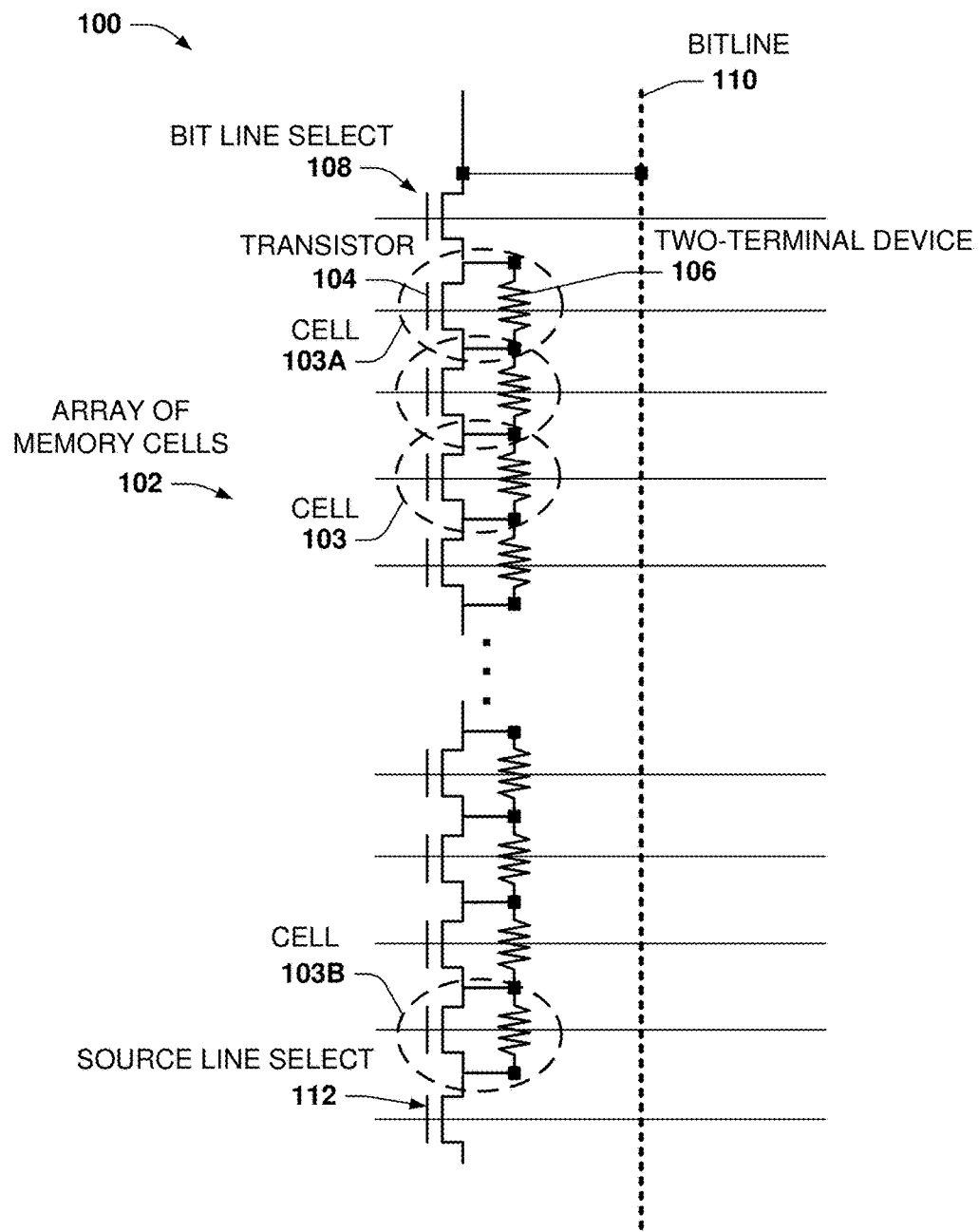
FIG. 1 illustrates a schematic diagram of a sample resistive memory array scalable to advanced technology nodes in disclosed embodiments.

This disclosure relates to resistive-switching two-terminal memory devices and one or more process(es) for manufacturing such device(s). Resistive-switching two-terminal memory cells (also referred to as resistive-switching memory cells or resistive-switching memory), as utilized herein, comprise circuit components having two conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM). Non-volatile resistive switching memory, when formed into an array, can be activated or deactivated respectively by a suitable switching device or activation device (e.g., a transistor switch in the context of a one transistor, one resistor (1T1R) arrangement), or multiple resistive-switching memory cells can collectively be activated or deactivated by a single switching device (e.g., multiple resistive memory cells can be activated by a single transistor switch in a one transistor, many resistor (1TnR) arrangement).

One class of resistive-switching two-terminal memory devices is a filamentary based device, having multiple filamentary states each with measurably distinct electrical resistances. Composition of filamentary-based devices can vary per device, with different components selected to achieve desired characteristics (e.g., volatility/non-volatility, on/off current ratio, switching time, read time, memory durability, program/erase cycle, and so on).

Embodiments of the subject disclosure can provide a filamentary-based memory cell. In some embodiments, the filamentary-based memory cell includes a non-volatile memory device, whereas other embodiments provide a volatile selector device, either alone or in electrical series with the non-volatile memory device. In further embodiments, both the volatile selector device and the non-volatile memory device can be filamentary-based devices, though the subject disclosure is not limited to these embodiments.

One example of a filamentary-based device can comprise: one or more conductive layers (e.g., comprising, e.g., TiN, TaN, TiW, metal compounds), an optional interface layer (e.g., doped p-type (or n-type) silicon (Si) bearing layer (e.g., p-type or n-type polysilicon, p-type or n-type polycrystalline SiGe, etc., or a combination of the foregoing)), a resistive switching layer (RSL) and an active metal layer capable of being ionized. Under suitable conditions, the active metal layer can provide filament forming ions to the RSL. In such embodiments, a conductive filament (e.g., formed by the ions) can facilitate electrical conductivity through at least a subset of the RSL, and a resistance of the filament-based device can be determined by a tunneling resistance (or, e.g., ohmic contact resistance) between the filament and the conductive layer. To reverse electrical conductivity resulting from the conductive filament, whether for the volatile selector device or the non-volatile memory device (with the exception of one-time programmable memory devices), the filament can be deformed. In some embodiments, deformation of the filament can comprise the particles (e.g., metal ions)—trapped within the defect locations—becoming neutral particles (e.g., metal atoms) in absence of the bias condition that have a high electrical resistance. In other embodiments, deformation of the filament can comprise dispersion (or partial dispersion) of the particles within the RSL, breaking a conductive electrical path provided by the filament in response to the bias condition. In still other embodiments, deformation of the filament can be in response to another suitable physical mechanism, or a suitable combination of the foregoing.

Generally, deformation of a conductive filament results from a change in the bias conditions to a second set of bias conditions. The second set of bias conditions can vary for different devices. For instance, deformation of a conductive filament formed within the volatile selector device can be implemented by reducing an applied bias below a formation magnitude (or small range of magnitudes, such as a few tens of a volt) associated with filament formation within the volatile selector device. Depending on the embodiment, a conductive filament can be created within a volatile selector device in response to a positive bias (e.g., forward bias) or in response to a negative bias (e.g., reverse bias), and deformation of the filament can occur in response to a suitable lower-magnitude positive bias or a suitable lower-magnitude negative bias, respectively. See U.S. patent application Ser. No. 14/588,185 filed Dec. 31, 2014 commonly owned by the assignee of the present application, and hereby incorporated by reference herein in its entirety and for all purposes. In contrast, deformation of a conductive filament formed within the non-volatile memory device can be implemented by providing a suitable erase bias (e.g., a reverse bias), having opposite polarity from a program bias (e.g., forward bias) utilized to form the conductive filament within the non-volatile memory device.

In various embodiments of a memory cell of the present disclosure, a conductive layer may include a metal, a doped semiconductor, titanium, titanium nitride (TiN), tantalum nitride (TaN), tungsten (W) or other suitable electrical conductor. The RSL (which can also be referred to in the art as a resistive switching media (RSM)) can comprise, e.g., an undoped amorphous Si layer, a semiconductor layer having intrinsic characteristics, a silicon nitride (e.g. SiN, $Si_3N_4$, $SiN_X$ where x is a suitable positive number, etc.), a Si sub-oxide (e.g., $SiO_y$ wherein y has a value between 0.1 and 2), a Si sub-nitride (e.g., $SiN_y$ wherein y has a value between 0.1 and 2), an Al sub-oxide, an Al sub-nitride, and so forth. Other examples of materials suitable for the RSL could include $Si_X Ge_Y O_Z$ (where X, Y and Z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) or other suitable oxides, a metal nitride (e.g., AlN, $AlN_F$ where F is a suitable positive number), a non-stoichiometric silicon compound, and so forth, or a suitable combination thereof. In various embodiments, the RSL includes a number of material voids or defects to trap or hold particles in place, in the absence of an external program stimulus causing the particles to drift within the RSL and form the conductive filament. For the non-volatile memory device then, the particles can remain trapped in the absence of the external program stimulus, requiring a suitable reverse bias (e.g., a negative polarity erase stimulus) to drive the particles out of the voids/defects, or otherwise break continuity of the conductive filament, thereby deforming the conductive filament.

The contact material layer can be comprised of any suitable conductor, such as a conductive metal, a suitably doped semiconductor, or the like. Where utilized, the contact material layer can be employed to provide good ohmic contact between the RSL and a metal wiring layer of an associated memory architecture. In some embodiments, the contact material layer can be removed and the RSL can be in physical contact with a metal wiring layer. Suitable metal wiring layers can include copper, aluminum, tungsten, platinum, gold, silver, or other suitable metals, suitable metal alloys, or combinations of the foregoing. In further embodiments, a diffusion mitigation layer or adhesion layer can be provided between the RSL and the metal wiring layer (or between the RSL and the contact material layer).

Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations (e.g., alloys, etc.) of the foregoing or similar materials can be employed for the active metal layer in some aspects of the subject disclosure. In some embodiments, a thin layer of barrier material composed of Ti, TiN, or the like, may be disposed between the RSL and the active metal layer (e.g., Ag, Al, and so on). Details pertaining to additional embodiments of the subject disclosure similar to the foregoing example(s) can be found in the following U.S. patent applications that are licensed to the assignee of the present application for patent: application Ser. No. 11/875,541 filed Oct. 19, 2007, application Ser. No. 12/575,921 filed Oct. 8, 2009, and the others cited herein, each of which are incorporated by reference herein in their respective entireties and for all purposes.

In response to a suitable program stimulus (or set of stimuli) a conductive path or a filament of varying width and length can be formed within a relatively high resistive portion of a non-volatile memory device (e.g., the RSL). This causes a memory cell associated with the non-volatile memory device to switch from a relatively high resistive state, to one or more relatively low resistive states. In some resistive-switching devices, an erase process can be implemented to deform the conductive filament, at least in part, causing the memory cell to return to the high resistive state from the low resistive state(s), as mentioned previously. This change of state, in the context of memory, can be associated with respective states of a binary bit or multiple binary bits. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in respective memory cells.

In some embodiments, the active metal layer can comprise a metal nitride selected from the group consisting of: $TiN_x$, $TaN_x$, $AlN_x$, $CuN_x$, $WN_x$ and $AgN_x$, where x is a positive number. In other embodiments, the active metal layer can comprise a metal oxide selected from the group consisting of: $TiO_x$, $TaO_x$, $AlO_x$, $CuO_x$, $WO_x$ and $AgO_x$. In other embodiments, the active metal layer can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. In some embodiments, the switching layer can comprise a material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x. Various combinations of the above are envisioned and contemplated within the scope of embodiments of the present invention.

In an embodiment, the active metal layer can comprise a metal nitride: $MN_x$, e.g. AgNx, TiNx, AlNx, and the switching layer can comprise a metal nitride: $MN_y$, e.g. AgNy, TiNy, AlNy, where y and x are positive numbers, and in some cases y is larger than x. In another embodiment, the active metal layer can comprise a metal oxide: $MO_x$, e.g. AgOx, TiOx, AlOx, and the switching layer can comprise a metal oxide: $MO_y$, e.g. AgOy, TiOy, AlOy, where y and x are positive numbers, and in some cases y is larger than x. In still other embodiments, the metal compound of the active metal layer is selected from a first group consisting of: $MN_x$ (e.g., $AgN_x$, $TiN_x$, $AlN_x$), and the switching layer comprises $MO_y$ (e.g. $AgO_x$, $TiO_x$, $AlO_y$) or $SiO_y$, where x and y are typically non-stoichiometric values.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

According to various disclosed embodiments, disclosed resistive switching devices can be fabricated consistent with foundry compatible processes. As utilized herein, foundry compatible refers to consistency with physical constraints associated with fabrication of a semiconductor-based device in a commercial semiconductor fabrication foundry, such as Taiwan Semiconductor Manufacturing Corporation, among others. Physical constraints include a thermal budget (e.g., maximum operating temperature) of a die, and of materials and metals constructed on the die prior to a given process step. For example, where a die comprises one or more metal layers or constructs, and viability of device models require the metal layers to maintain tight position tolerance, the thermal budget may be set by the softening temperature of the metal(s) to avoid loss of metal rigidity. Other physical constraints can include, CMOS, nMOS or pMOS fabrication constraints, where suitable, fabrication toolset limitations of a particular metallization scheme (e.g., etching/masking/grooving toolsets available for Aluminum, Copper, etc.), physical properties requiring special process handling (e.g., dispersion properties of Cu, oxidation properties of metals, semi-conducting materials, etc.), or the like, or other constraints of commercial foundry. Accordingly, the phrase "foundry compatible" implies consistency with process limitations of at least one commercial semiconductor fabrication foundry.

Thermal budget refers to an amount of thermal energy transferred to a wafer during a particular temperature operation. During the process of manufacturing the resistive memory, for example, there is a desire to not adversely affect complementary metal oxide semiconductor (CMOS) devices by application of excess heat, or the like. Accordingly, CMOS devices within a substrate can impose a thermal budget constraint to the manufacture of memory components upon a CMOS chip or substrate (e.g., by way of a backend of line fabrication process). Likewise, thermal budget constraints should be considered during the manufacture of a resistive memory device in an integrated circuit, for instance.

An integrated circuit (IC) foundry includes various equipment and processes that are leveraged in order to incorporate the resistive memory into the backend of line process. The inventors of the present disclosure are familiar with backend material compatibility issues associated there with. The one or more disclosed aspects can perform the process of fabricating the resistive memory device in a relatively simple manner compared to other resistive memory fabrication processes. For example, a common material(s), or common process step(s) can be employed in fabricating differently configured memory arrays (e.g., 1T1R, 1TnR) disclosed herein.

An integrated circuit (IC) foundry includes various equipment and processes that are leveraged in order to incorporate the resistive memory into the backend of line process. The inventors of the present disclosure are familiar with backend material compatibility issues associated there with. The one or more disclosed aspects can perform the process of fabricating the resistive memory device in a relatively simple manner compared to other resistive memory fabrication processes. For example, a common material(s), or common process step(s) can be employed in fabricating differently configured memory arrays (e.g., 1T1R, 1TnR) disclosed herein.

Further, one or more disclosed aspects can enable smaller die sizes and lower costs through one or more disclosed processes for monolithic integration of resistive memory onto a product of a frontend of line process (e.g., e.g., a MOS substrate, including CMOS, nMOS, or pMOS devices). Further, the fabrication of the resistive memory devices may be performed using standard IC foundry-compatible fabrication processes. Various embodiments can also be implemented without design changes after monolithic integration (e.g., over a CMOS device) to account for changes in parasitic structure. A parasitic structure is a portion of the device (e.g., memory device) that resembles in structure a different semiconductor device, which might cause the device to enter an unintended mode of operation. Further, in at least one disclosed embodiment, there is provided a product (e.g., a memory device) of a fabrication process that can comprise monolithic integration of resistive memory over a CMOS circuitry. Further, the fabrication process can comprise IC foundry-compatible processes in a further embodiment (e.g., new or different processes are not necessary, though in alternative embodiments future improvements to such processes should not be excluded from the scope of various aspects of the present disclosure). In addition, the disclosed aspects can be performed within a thermal budget of frontend of line devices.

In various embodiments of the present disclosure, there are provided architectures for fabricating arrays of two-terminal resistive switching memory cells having respective areas of $4F^2$, where F is a minimum feature size (or technology node) of a semiconductor fabrication process. As an example, for a 28 nm minimum feature size, disclosed architectures can provide resistive switching memory cells that respectively consume $4*(28\ nm)^2$, or 3136 $nm^2$ of silicon space. Moreover, the disclosed architectures are highly scalable at advanced technology nodes, yielding proportionately higher memory densities for smaller minimum feature sizes (e.g., 22 nm, 14 nm, 10 nm, 7 nm, etc.). In some embodiments, there are provided example arrays of memory cells organized logically in NAND architectures, where each memory cell comprises a two-terminal resistive switching memory cell electrically in parallel to a transistor. Furthermore, respective memory cells of the array can have area as small as $4F^2$, resulting in memory devices having high memory densities in addition to the excellent memory retention, longevity and high read and write times of resistive switching memory cells.

Referring now to the drawings, FIG. 1 depicts a schematic diagram of an example NAND circuit 100 according to various disclosed embodiments. NAND circuit 100 can be fabricated over a semiconductor substrate as part of an integrated chip, in one example. In another example, NAND circuit 100 could be constructed in a three dimensional architecture, for instance, where memory components (e.g., memory cells, transistor components, two-terminal device components, etc.) are constructed in front end of line processes, back end of line processes, or a combination of the foregoing. Moreover, NAND circuit 100 can be replicated many times and arranged in various two-dimensional arrays of NAND circuits, such as blocks, sub-blocks, pages, and so forth. In further embodiments, two-dimensional arrays of NAND circuit 100 can be stacked in a third dimension. Accordingly, it should be appreciated that NAND circuit 100 and other embodiments of NAND arrays disclosed herein should not be construed as being limited to the depicted embodiment(s), unless clear from context.

NAND circuit 100 can comprise an array of memory cells 102, in which respective memory cells 103 of the array are arranged electrically in serial with other such memory cells 103. Respective memory cells 103, such as memory cell 103A, can be comprised of a parallel 1T-1R arrangement including a transistor 104 arranged electrically in parallel with a two-terminal resistive switching memory device 106. Transistor 104 can be a three-terminal semiconductor transistor of various suitable technologies. Examples can include a field effect transistor (FET) or various derivatives of the FET, such as carbon nanotube FET, metal oxide semiconductor FET (MOSFET), junction FET (JFET), organic FET (OFET), dual-gated FET, Fin-FET, etc., an insulated-gate bipolar transistor, a thin film transistor, and others. Two-terminal memory device 106 can comprise a non-volatile memory device in some aspects. Examples can include a resistive-switching device in at least one aspect. In other aspects, two-terminal memory device 106 can comprise a resistive random access memory, a ferromagnetic memory, a phase change memory, a magneto-resistive memory, an organic memory, a conductive bridging memory, or a suitable combination thereof. Respective memory cells 103 have a first shared node that connects a first transistor terminal of an associated transistor 104 (e.g., source, drain) with a corresponding first terminal of an associated two-terminal memory device 106. A second shared node connects a second transistor terminal (e.g., drain, source) of the associated transistor 104 with a corresponding second terminal of the associated two-terminal memory device 106.

As depicted, respective memory cells 103 of the array of memory cells 102 can be connected in series, in which a second shared node of one memory cell 103 is connected to a first shared node of a subsequent memory cell 103. In at least some disclosed embodiments, a first memory cell 103A of the array is connected at a first shared node to a bit line select transistor 108 (bit line select 108) and a last memory cell 103B of the array is connected at a second shared node to a source line select transistor 112 (source line select 112). Bit line select 108 can be activated or deactivated by a select line, and when activated, connects a signal applied to a bitline 110 to the first shared node of first memory cell 103A. Accordingly, the signal (e.g., voltage, current) applied to bitline 110 can be applied to array of memory cells 102 by activation of bit line select 108, and the signal can be isolated from array of memory cells 102 by deactivation of bit line select 108. Source line select 112 can be activated or deactivated by a source line. A second node of source line select 112 can be connected to ground, a second signal (e.g., a reverse bias, an erase bias, or the like) or a read circuit to facilitate various memory operations for array of memory cells 102.

In operation, a signal applied to array of memory cells 102 will propagate primarily through either the transistor 104 or two-terminal memory device 106, of respective memory cells 103 of the array of memory cells 102. In various embodiments, an activation resistance of transistors 104 can be substantially lower in magnitude than activation or deactivation resistances of two-terminal memory device 106. Accordingly, when a transistor 104 of a memory cell 103 is activated, the signal will primarily propagate through the activated transistor 104 and bypass the two-terminal memory device 106 of that memory cell 103. In further embodiments, a deactivation resistance of transistors 104 can be substantially higher in magnitude than the activation or deactivation resistances of two-terminal memory device 106, causing the signal to primarily propagate through the two-terminal memory device 106 of that memory cell 103. To apply an operation signal (e.g., read, write, erase signal, etc.) to a particular two-terminal memory device 106 of a particular memory cell 103A, the transistor 104 of the particular memory cell 103A is deactivated, directing the operational signal through the particular two-terminal memory device 106. Transistors 104 of other memory cells 103 can be activated, directing the operational signal through the transistors of these other memory cells 103. In such a manner the operational signal can be directed to a single memory cell 103 of array of memory cells 102.

Figure 2:
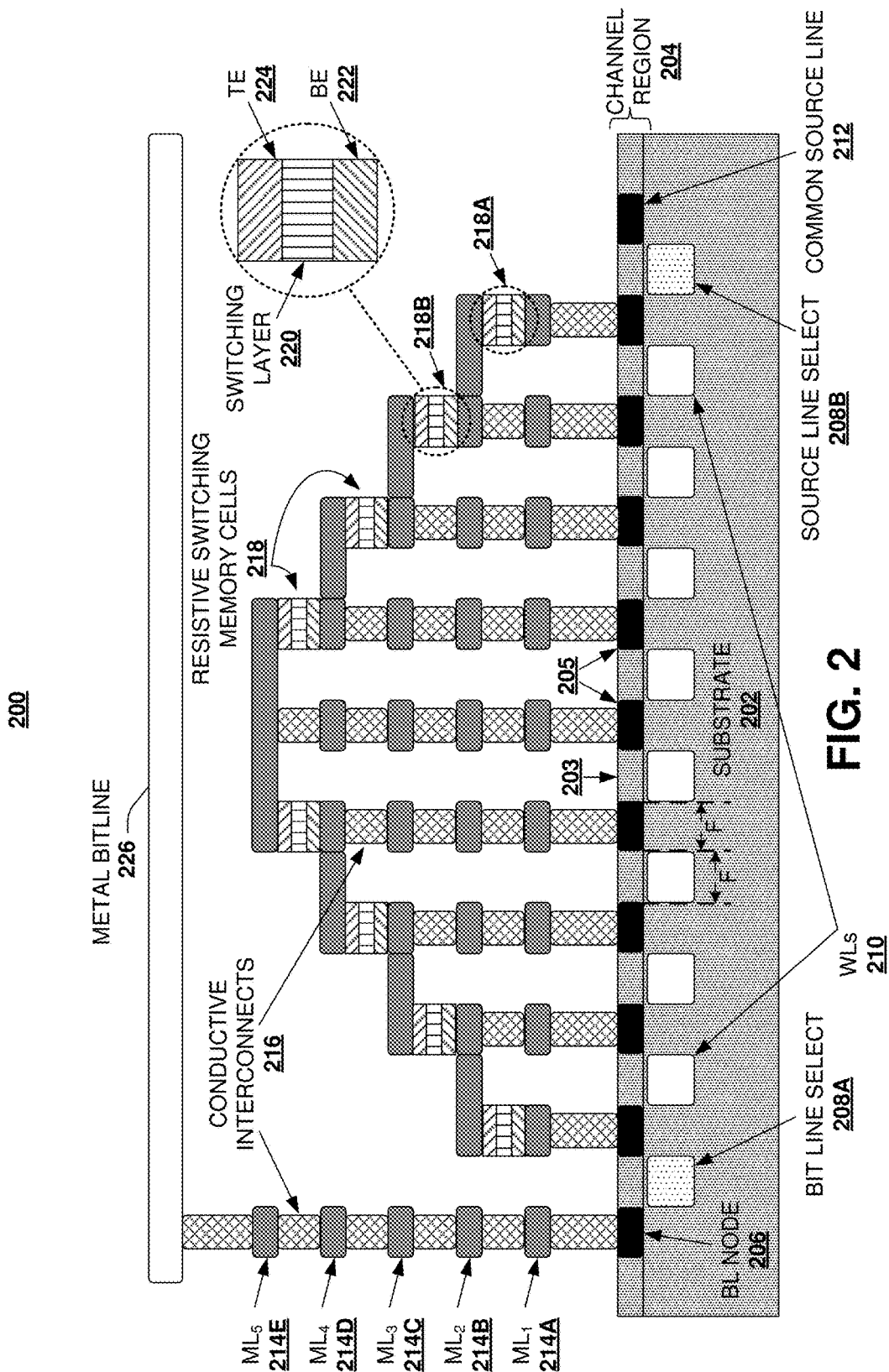
FIG. 2 depicts a block diagram of a sample memory array having a logical NAND architecture with cells of about $4F^2$ silicon area, in an embodiment.

FIG. 2 illustrates a side-view diagram of an example chip 200 that includes an array of memory devices. Respective memory devices of the array can comprise a parallel 1T1R arrangement of a transistor and a resistive switching memory cell. In various embodiments, respective memory devices of the array can have an area of $4F^2$.

Chip 200 can comprise a substrate 202 with buried wordlines 210 formed within the substrate 202. A channel region 204 can be formed with conductive regions 205 (illustrated in black) interspersed between semiconducting regions 203 of substrate 202. In various embodiments, conductive regions 205 can be formed by suitably doping subsets of substrate 202 to form the black conductive regions 205 to have higher electrical conductivity than substrate 202. In other embodiments, conductive regions 205 can be formed by deposition, implantation, etc., of any suitable conductive material (e.g., metal, metal compound, metal alloy, doped semiconducting material, and so forth) into substrate 202. In an embodiment(s), respective buried wordlines 210 and respective conductive regions 205 and semiconducting regions 203 can each have a width of F. Arranged as depicted, buried wordlines 210 can facilitate conductivity of an adjacent semiconducting region 203, and therefore conductivity between two conductive regions 205 adjacent the semiconducting region 203. As such, buried wordlines 210, semiconducting regions 203 and conductive regions 205 form an electrically serial array of transistors.

Overlying channel region 204 is a set of metal layers, including a first metal layer 214A ($ML_1$), a second metal layer 214B ($ML_2$), a third metal layer 214C ($ML_3$), a fourth metal layer 214D ($ML_4$) and a fifth metal layer 214E ($ML_5$) (referred to collectively as metal layers 214A-214E). In some embodiments, metal layers 214A-214E can be back-end-of-line metal layers, and can include more or fewer metal layers than depicted (e.g., for a chip comprising more or fewer memory cells per array); the scope of the present disclosure is not limited to the number of metal lines and memory cells depicted for chip 200.

Conductive interconnects 216 are provided between respective metal layers 214A-214E, as depicted by cross-hatched blocks of FIG. 2. As depicted, respective metal lines of first metal layer 214A are connected to respective conductive regions 205 within channel region 204 by respective conductive interconnects 216. Or described differently, no two-terminal resistive memory cells 218 are formed between channel region 204 and first metal layer 214A in some disclosed embodiments. In other embodiments, however, one or more two-terminal resistive memory cells can be formed between paired conductive regions 205 and metal lines of the first metal layer 214A in place of one or more conductive interconnects 216.

In the embodiment depicted by FIG. 2, a pair of resistive switching memory cells 218 is formed between pairs of metal layers 214A-214E. Moreover, adjacent resistive switching memory cells 218 are formed between different pairs of metal layers 214A-214E, as illustrated by memory cells 218A and 218B. For instance, memory cell 218A has a first terminal, or bottom electrode 222, connected electrically to a metal line of first metal layer 214A that serves as a first node for memory cell 218A. Memory cell 218A has a second terminal, or top electrode 224, connected electrically to a second metal line of second metal layer 214B that serves as a second node for memory cell 218A. A non-volatile switching layer 220 is provided between the bottom electrode 222 and top electrode 224. As depicted, the first node is also connected to one conductive region 205 and the second node is connected to an adjacent conductive region 205, causing the resistive switching memory cell 218 to be electrically in parallel to a first transistor of the array of transistors.

Electrically in serial to memory cell 218A is a second memory cell 218B. Second memory cell 218B has a bottom electrode 222 connected to the second node formed by the second metal line of second metal layer 214B, and a top electrode 224 connected to a third node formed by a third metal line of third metal layer 214C. Additionally, the third node is connected to a third conductive region 205, causing second memory cell 218B to be electrically in parallel to a second transistor of the array of transistors. Utilizing the five backend metal layers depicted by metal layers 214A-214E, at least 8 resistive switching memory cells 218 can be formed per NAND array of memory cells.

In operation, a bitline select transistor 208A (bit line select 208A) can be activated to electrically connect a metal bitline 226 to the array of memory cells via a bitline node 206. Bitline node 206 is connected to a first of the memory cells of the serially connected array (e.g., analogous to cell 103A of FIG. 1). A source line select transistor 208B connects a last of the memory cells of the serially connected array (cell 218A) to a source line 212. With bit line select 208A and source line select 208B activated, a voltage, current, etc. applied across metal bitline 226 and source line 212 can be applied to the array of memory cells, as described at FIG. 1, supra. In one or more embodiments of the present disclosure, chip 200 provides a device consistent with the schematic diagram of NAND circuit 100, in which individual memory cells of the NAND circuit 100 have an area of 4F$^2$.

Figure 3:
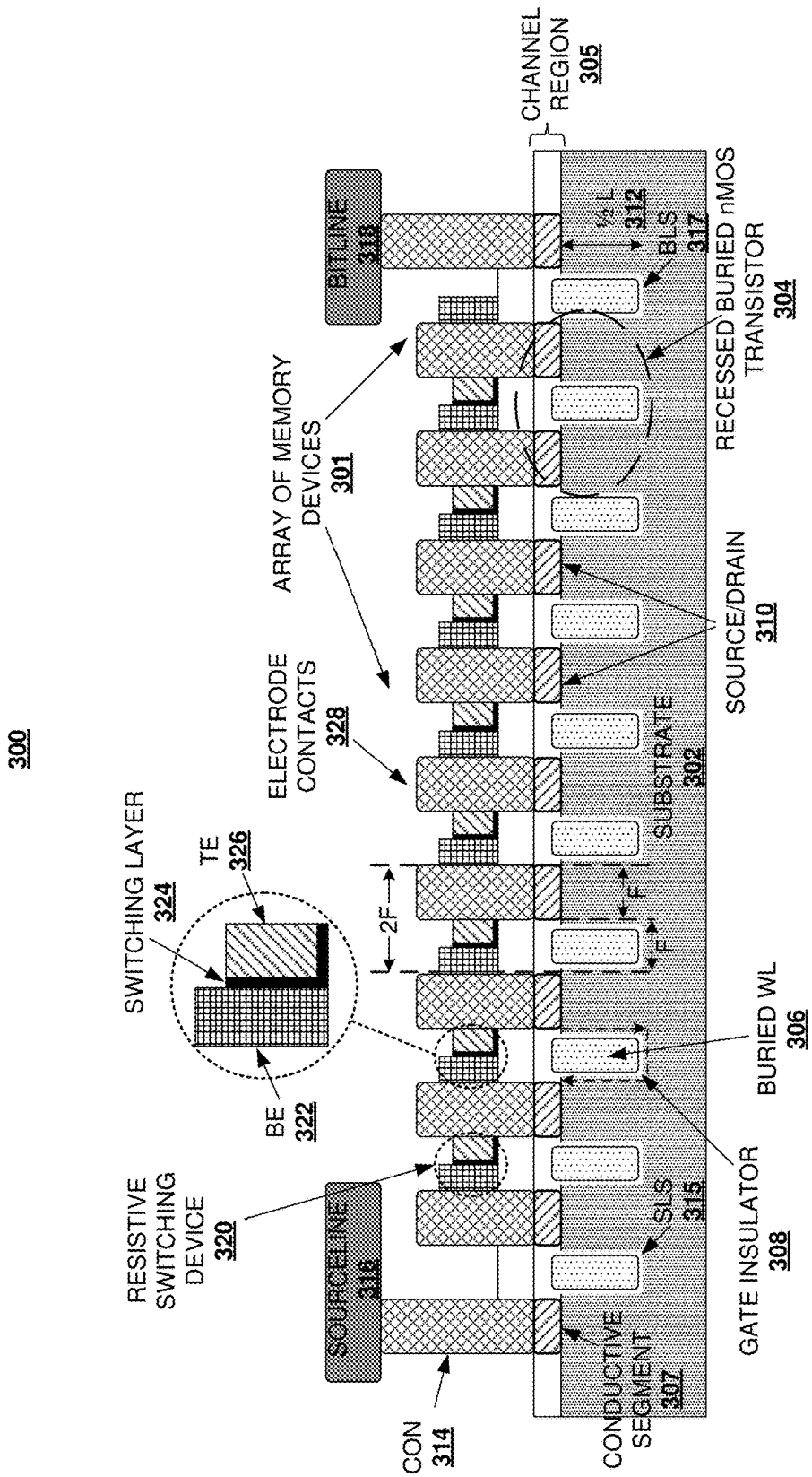
FIG. 3 illustrates a block diagram of a sample memory device having a logical NAND architecture and $4F^2$ silicon area, in an alternative embodiment.

FIG. 3 illustrates a block diagram of an example chip 300 that includes an array of memory devices 301 according to alternative or additional embodiments of the present disclosure. In some embodiments, chip 300 can provide an array of memory devices 301 consistent with the schematic diagram of array of memory cells 102 of FIG. 1, supra, with respective memory devices having an area as small as 4F$^2$. Additionally, the array of memory devices 301 can be formed between a single pair of backend metal layers (or between a substrate and a single backend metal layer), decoupling the number of devices that can be fabricated in the array from a number of backend metal layers provided for chip 300. Described differently, array of memory devices 301 can be an 8-cell array, 16-cell array, 32-cell array, 64-cell array, 128-cell array, or a larger (or smaller) number of cells, independent from the number of backend metal layers included within chip 300. Accordingly, chip 300 can potentially achieve a high density of memory devices 301, by increasing a number of cells per array, and increasing a ratio of chip space consumed by memory cells versus chip space consumed by supporting array structure (e.g., vertical interconnects, sourcelines, bitlines, select hardware, etc.).

Chip 300 comprises a substrate 302 having a set of recessed, buried nMOS transistors 304 forming therein. The nMOS transistors 304 can be formed from buried wordlines 306 within substrate 302, according to one or more embodiments, and a doped channel region 305. A gate insulator (e.g., gate oxide, etc.) having high electrical resistivity can be formed around buried wordlines 306, mitigating or preventing leakage currents within nMOS transistors 304. Buried wordlines 306 can have relatively small area on a top surface of substrate 302, compared to conventional transistors, enabling spacing between channel regions of nMOS transistors 304 to be reduced and generally reducing silicon space consumed by respective nMOS transistors 304. This can further facilitate increased memory density for chip 300. The buried wordline 306 and gate insulator 308 can form a conductive path around a perimeter of buried wordline 306, between two conductive segments 307 of channel region 305 serving as source and drain 310 of nMOS transistors 304 (see the dotted line defining a conductive path about buried wordline 306; note that the arrows are indicative of current flow but not necessarily of direction, as current is not restricted to flow between conductive segments 307 according to a particular orientation; rather, current flows according to relative application of high and low potential voltage, as known to one of ordinary skill in the art, which can be configurable based on operational circuitry (not depicted) applied to nMOS transistors 304). In one embodiment, source and drain 310 of nMOS transistors 304 can be n+ doped conductive segments 307.

Array of memory devices 301 further comprises a set of resistive switching devices 320 that overly channel region 305 and substrate 302. A vertical contact 314 connects a sourceline 316 to a source line select transistor 315 (SLS 315) of nMOS transistors 304, and a second vertical contact 314 connects a bitline 318 to another bit line select transistor 317 (BLS 317) of nMOS transistors 304. By activation of SLS 315 and BLS 317, a potential applied across sourceline 316 and bitline 318 can be applied to array of memory devices 301.

In addition to nMOS transistors 304, array of memory devices 301 include a set of resistive switching devices 320. As shown in the cut-out magnified illustration (dotted circle), respective resistive switching devices 320 include a bottom electrode 322, a switching layer 324, and a top electrode 326. In various disclosed embodiments, switching layer 324 can be a non-volatile switching medium, and resistive switching devices 320 can be non-volatile filamentary-based resistive switching memory cells. By utilizing thin film processing techniques, at least in part, BE 322, switching layer 324 and TE 326 can be formed collectively within a distance of 1F. In such embodiments, resistive switching devices 320 can have a width of 1F and electrode contacts can likewise have a width substantially of 1F, resulting in devices having 2F width, as illustrated by the dashed lines in FIG. 3.

Figure 4:
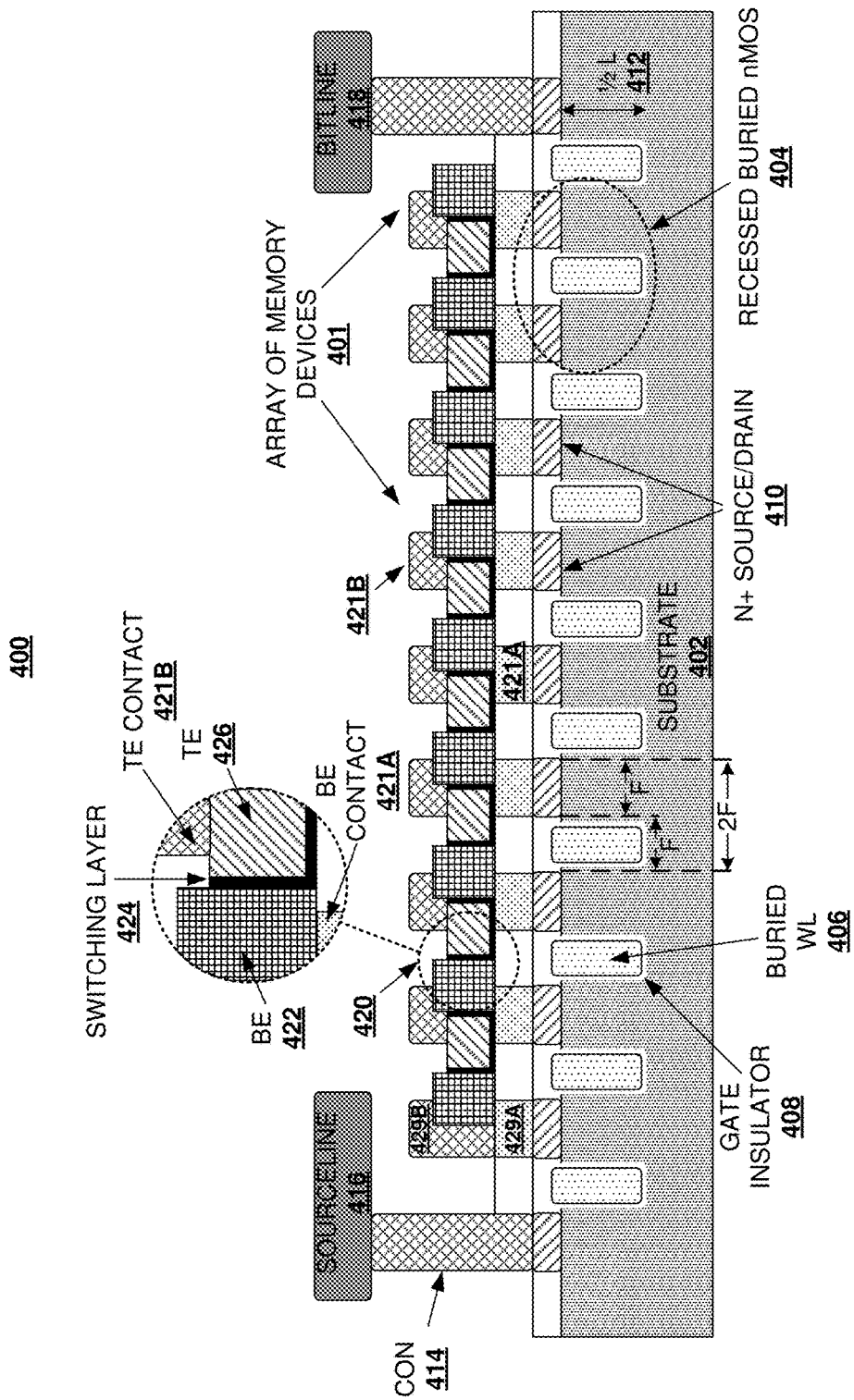
FIG. 4 depicts a block diagram of an example memory device having a logical NAND architecture and $4F^2$ silicon area in yet another embodiment.

FIG. 4 depicts a block diagram of a sample chip 400 according to alternative or additional embodiments of the present disclosure. Chip 400 can provide an array of memory devices 401 consistent with the schematic diagram for array of memory cells 102 of FIG. 1, in various embodiments. Respective memory devices 401 can comprise a recessed buried nMOS transistor 404 connected electrically in parallel with a resistive switching memory cell 420.

The recessed buried nMOS transistors 404 comprise a buried wordline 406 formed within a substrate 402 of chip 400. In an embodiment, substrate 402 can be a base material upon which other materials of chip 400 are formed, comprising a suitable semiconductor device (e.g., silicon, silicon germanium, and so forth). In another embodiment, substrate 402 can be formed above one or more other layers including the base material (not depicted), and therefore is not itself the base material for chip 400. In either embodiment, however, buried wordlines 406 are formed within substrate 402, and between adjacent source/drain segments 410 to form a set of recessed buried nMOS transistors 404.

Overlying substrate 402 are a set of resistive switching devices 420. As illustrated in the magnified cut-out (illustrated within the dotted circle), a resistive switching device 420 can comprise a bottom electrode 422 electrically connected to a BE contact 421A, a switching layer 424, and a top electrode 426 electrically connected to a TE contact 421B.

In addition to the foregoing, respective recessed buried nMOS transistors 404 can be connected electrically in parallel to respective resistive switching devices 420 via pairs of BE/TE contacts 421. Respective bottom electrode contacts 421A are in electrical contact with respective source/drain segments 410 of nMOS transistors 404, forming a parallel connection between a resistive switching device 420 and a nMOS transistor 404. Though each bottom electrode contact can be constructed beneath and in electrical contact with a top electrode contact (e.g., see the far left bottom electrode contact 429A and top electrode contact 429B), it should be appreciated that adjacent pairs of bottom/top electrode contacts, such as bottom electrode contact 421A and top electrode contact 421B, can serve as opposite terminals for a single two-terminal resistive switching device 420.

As illustrated, a sourceline 416 is connected to a first end of array of memory devices 401 by a vertical contact 414. A similar vertical contact can connect a bitline 418 to a second end of array of memory devices 401. Thus, a potential applied across sourceline 416 and bitline 418 is likewise applied across array of memory devices 401, facilitating operational control for voltage, current or field driven memory operations (e.g., a read operation, a write operation, an erase operation, etc.). By deactivating an nMOS transistor(s) 404 of array of memory devices 401, a resistive switching device(s) 420 that is electrically in parallel to the deactivated nMOS transistor(s) 404 is targeted for a memory operation. Likewise, by activating a subset of nMOS transistors 404, associated resistive switching devices 420 connected in parallel to the activated nMOS transistors are insulated from the memory operation. This facilitates bit-level operability for memory cells of array of memory devices 401 (and similarly for memory cells of chip 200 and chip 300). Furthermore, as indicated by the dashed lines, a single memory device 401 can be formed with a width of 2F, facilitating high density arrays of memory devices 401.

Example Methods for Fabrication of a Non-Volatile Memory Formed in a NAND Array and Having Area of $4F^2$ The diagrams included herein are described with respect to interaction between several memory cells, memory cell components, or memory architectures. It should be appreciated that such diagrams can include those memory cells, components and architectures specified therein, some of the specified memory cells/components/architectures, or suitable alternative or additional memory cells/components/architectures. Sub-components can also be implemented as electrically connected to other sub-components rather than included within a parent architecture. Moreover, some of the disclosed embodiments can be implemented as part(s) of other disclosed embodiments where suitable. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be read or programmed in groups (e.g., multiple memory cells read/programmed concurrently) or individually. Components of the disclosed architectures can also interact with one or more other components not specifically described herein but known by those of skill in the art or made evident by way of the context provided herein.

Figure 4A:
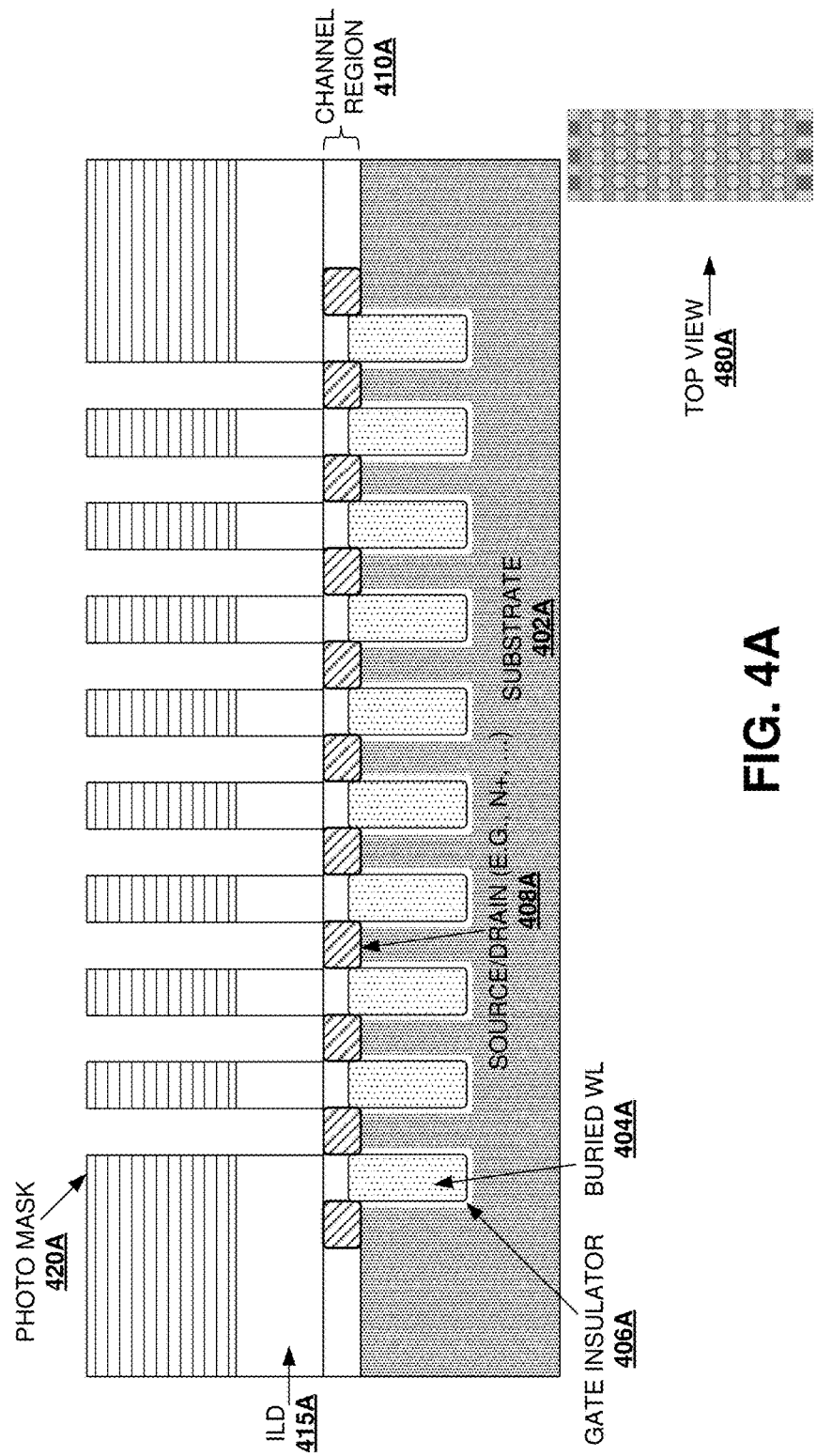
FIGS. 4A through 4K depict block diagrams of example process steps for fabricating an array of memory cells according to one or more embodiments.
Figure 4B:
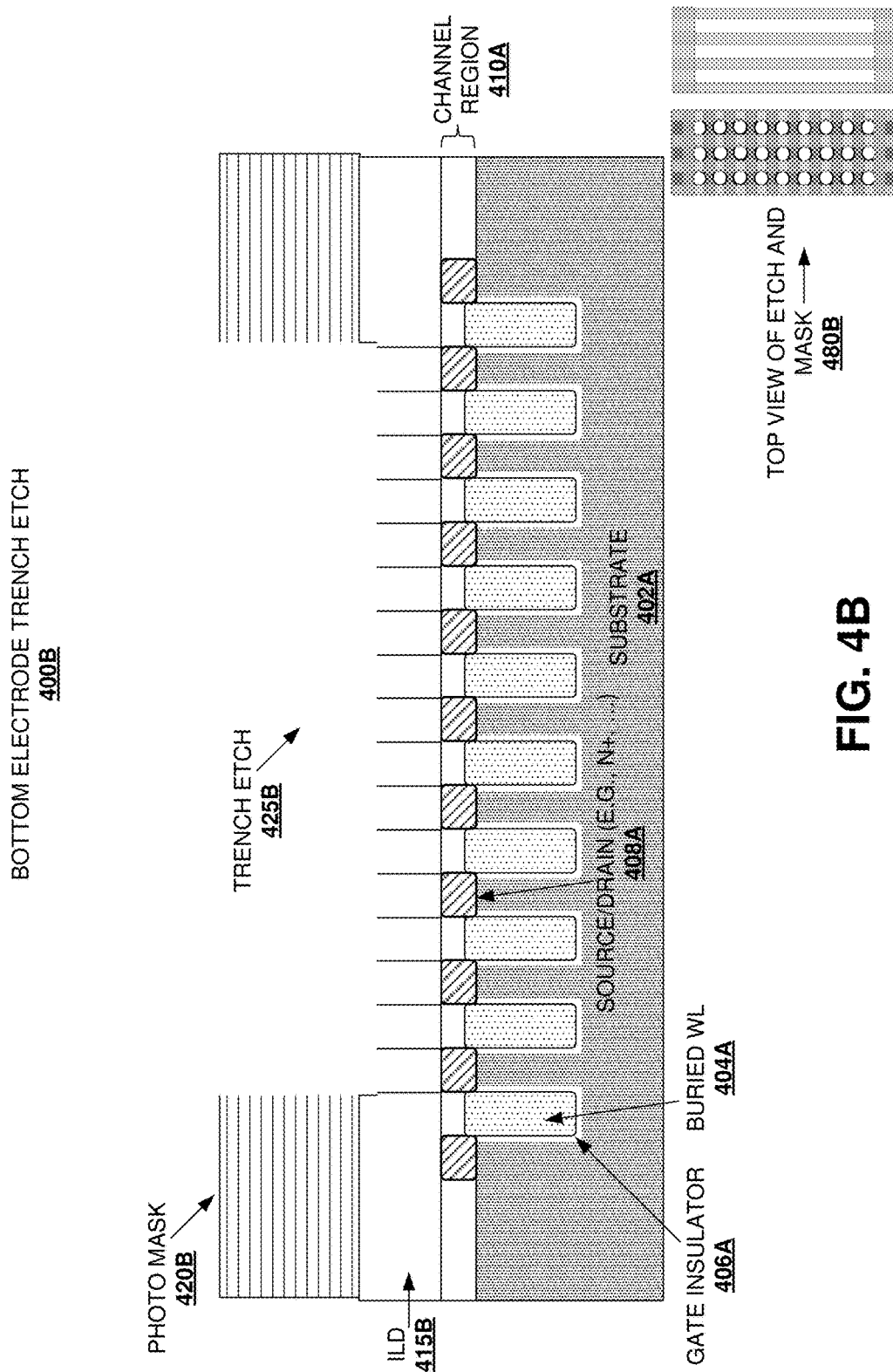
Figure 4C:
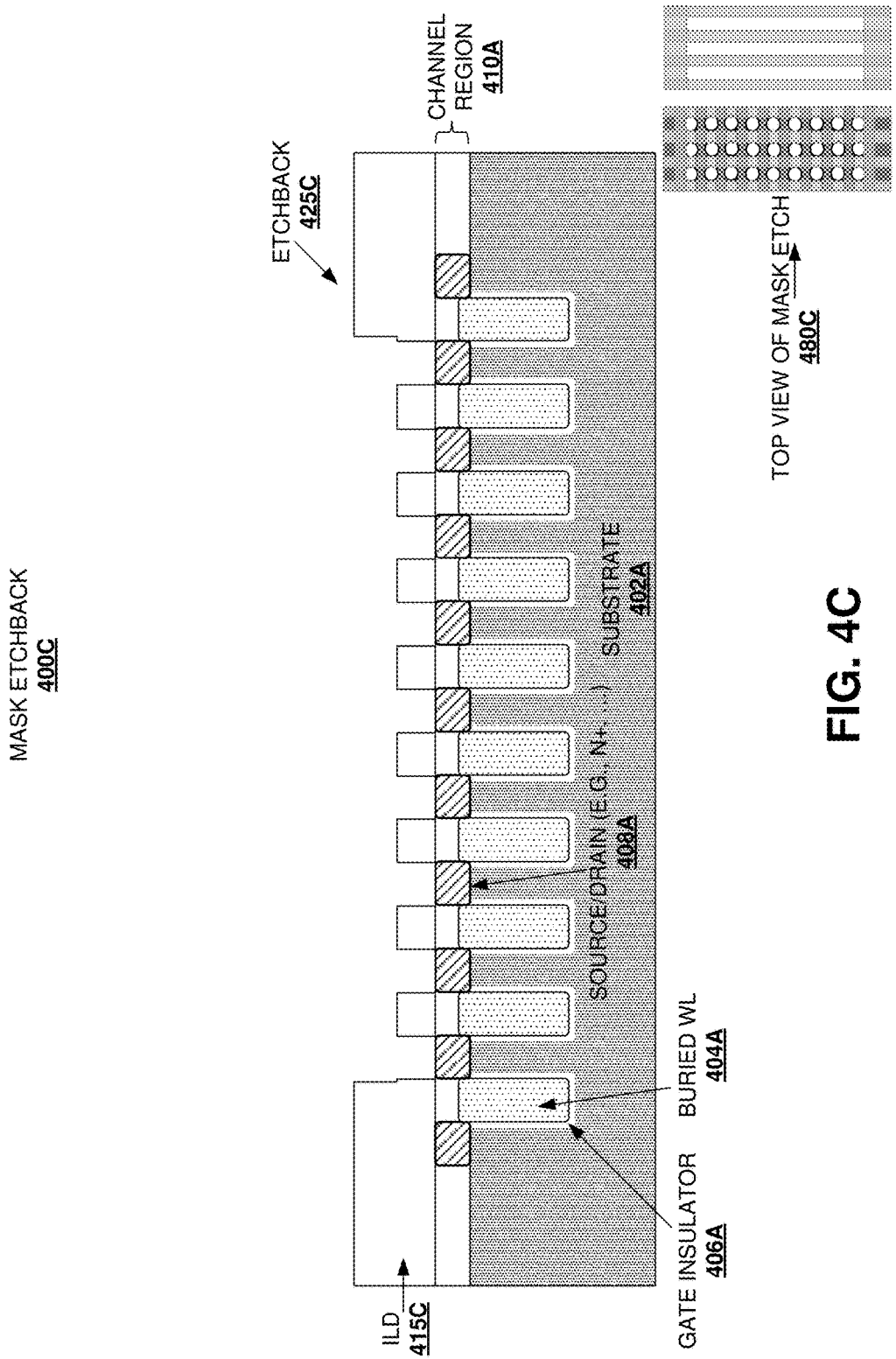
Figure 4D:
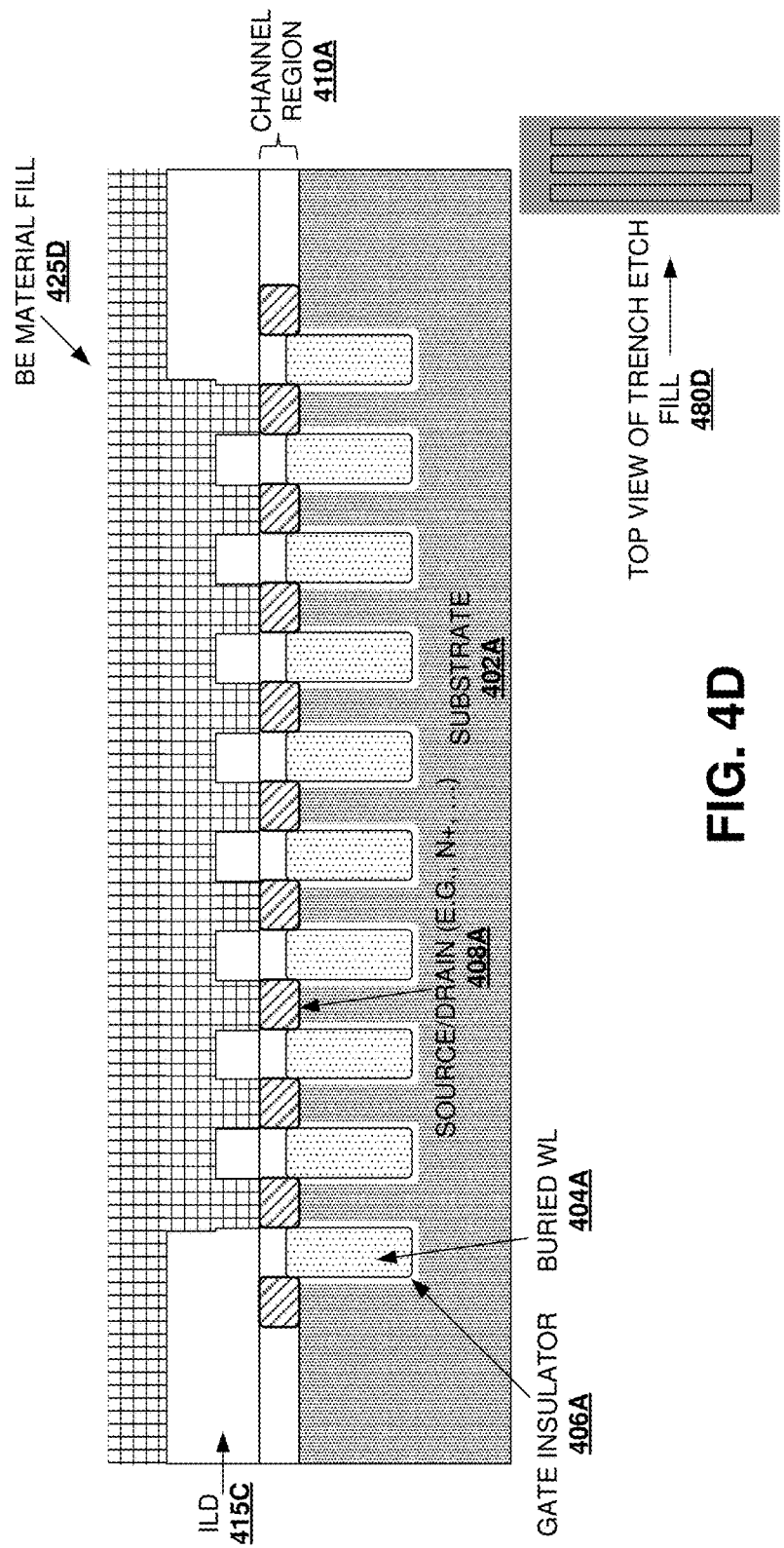
Figure 4E:
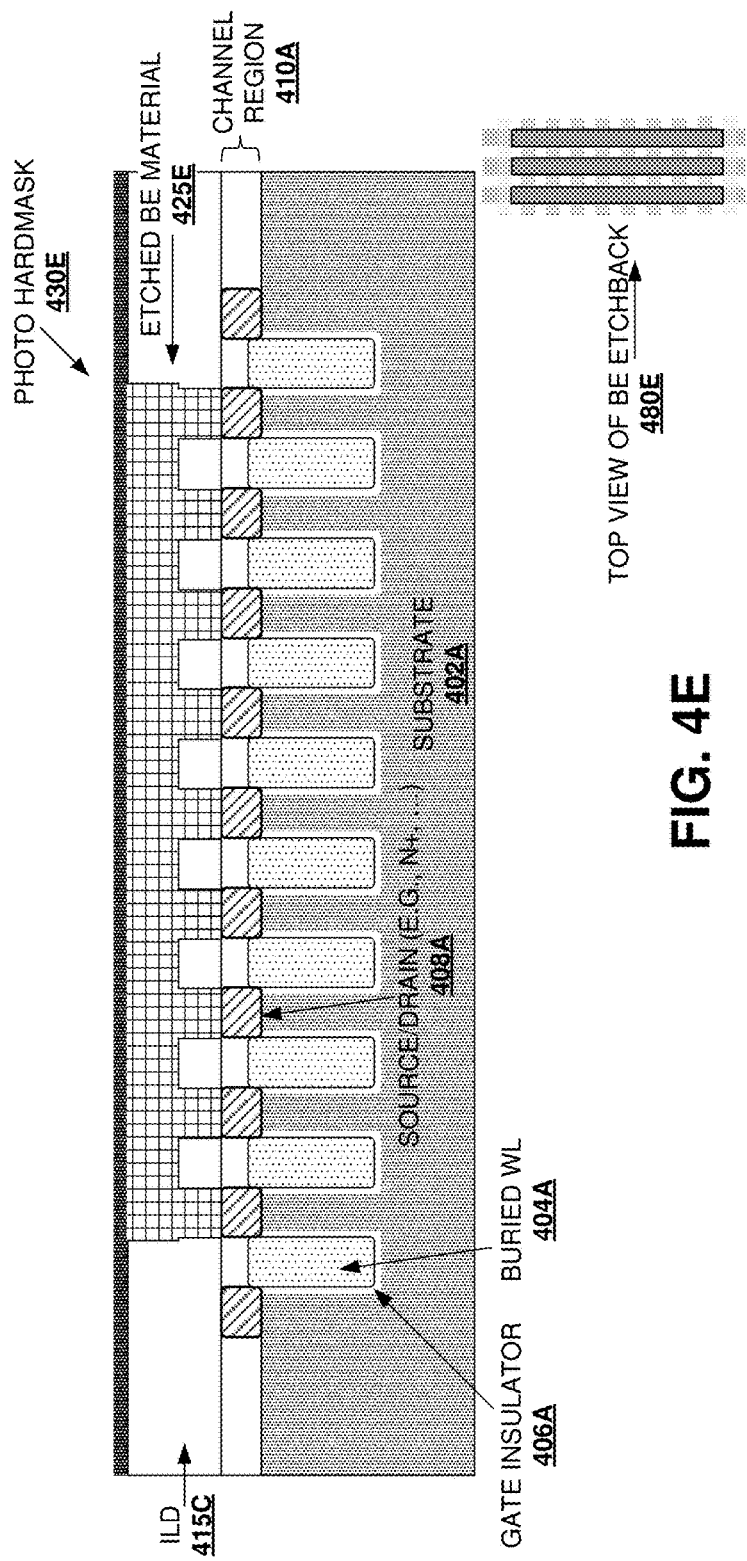
Figure 4F:
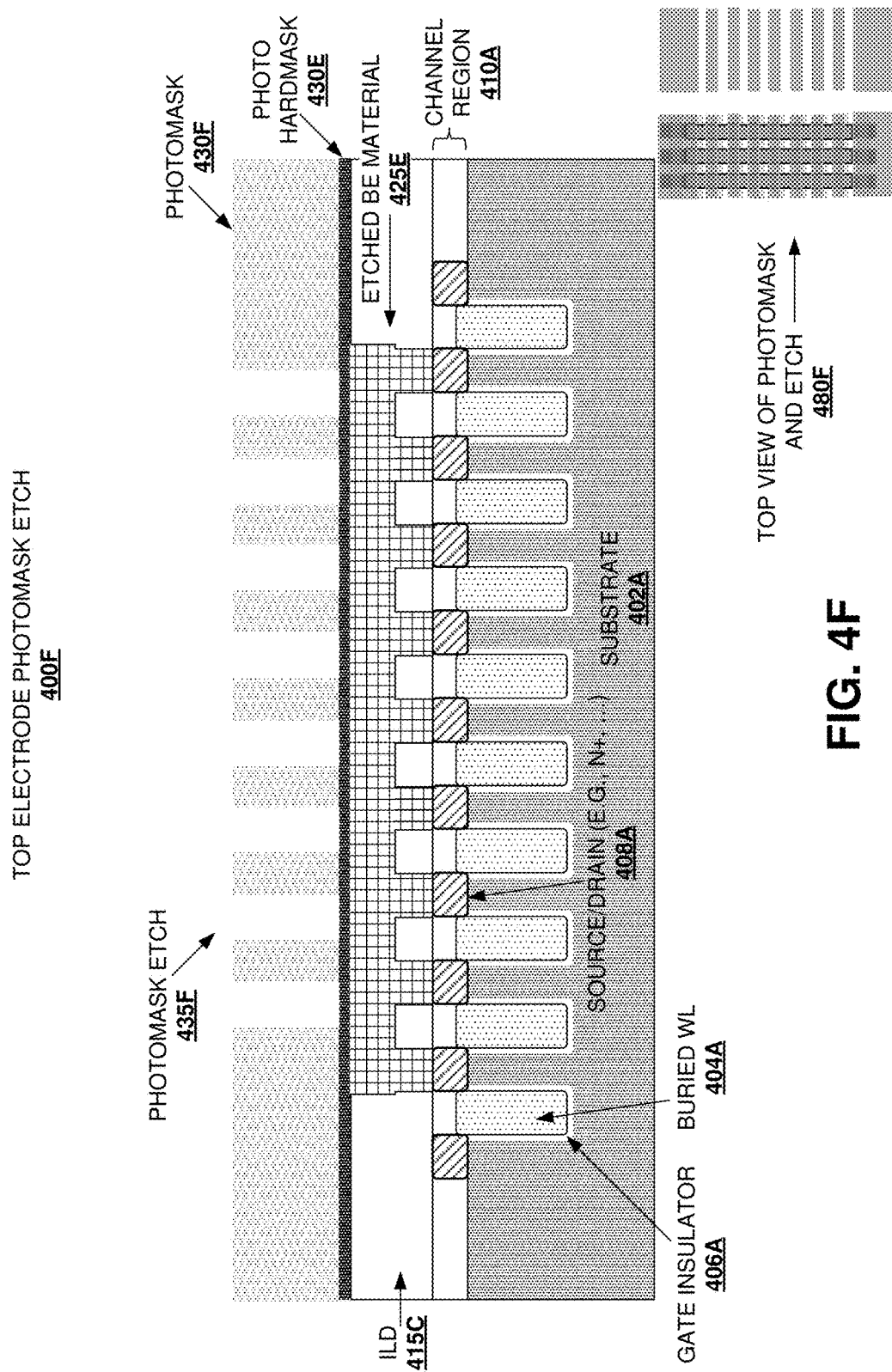
Figure 4G:
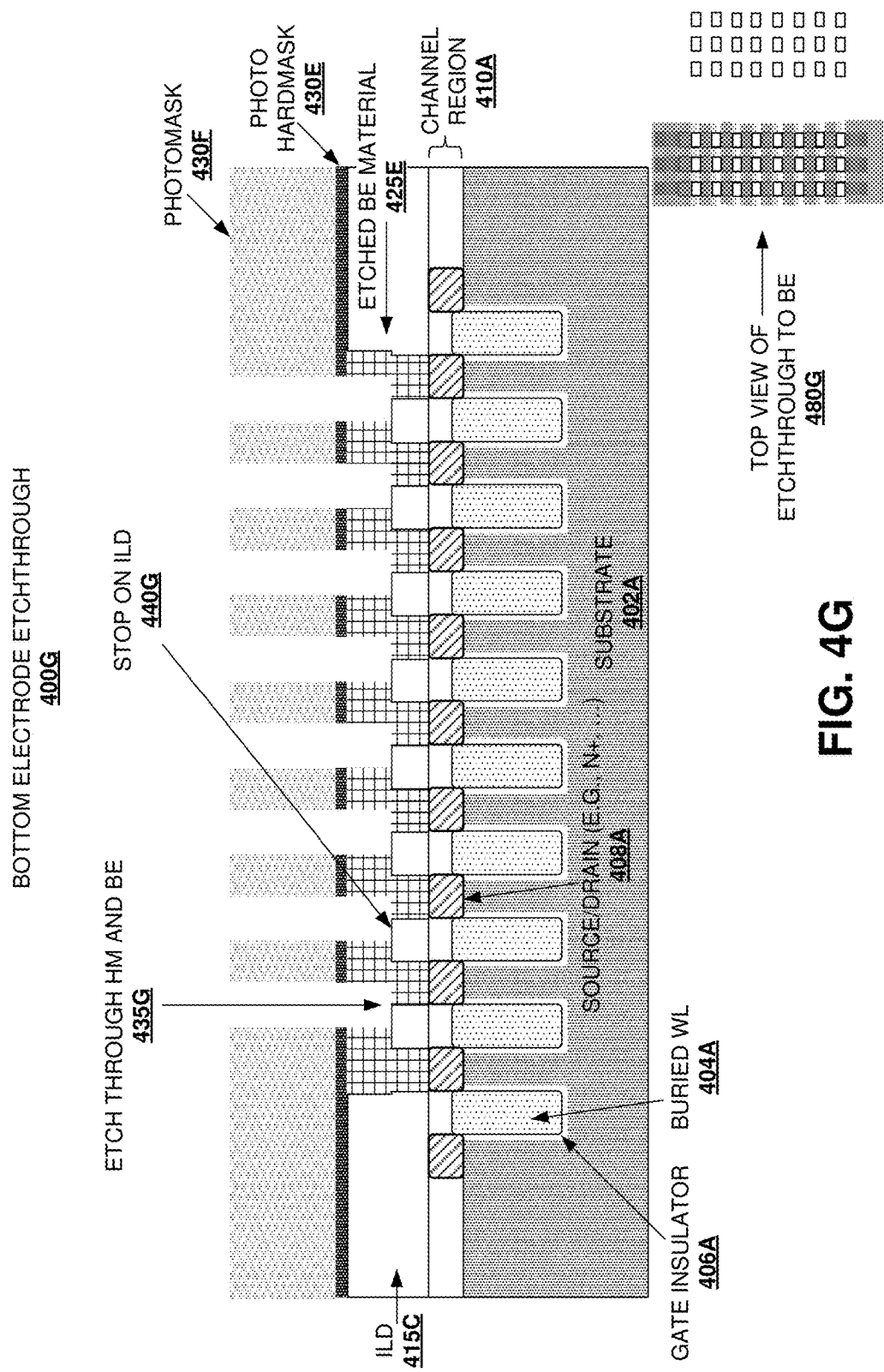
Figure 4H:
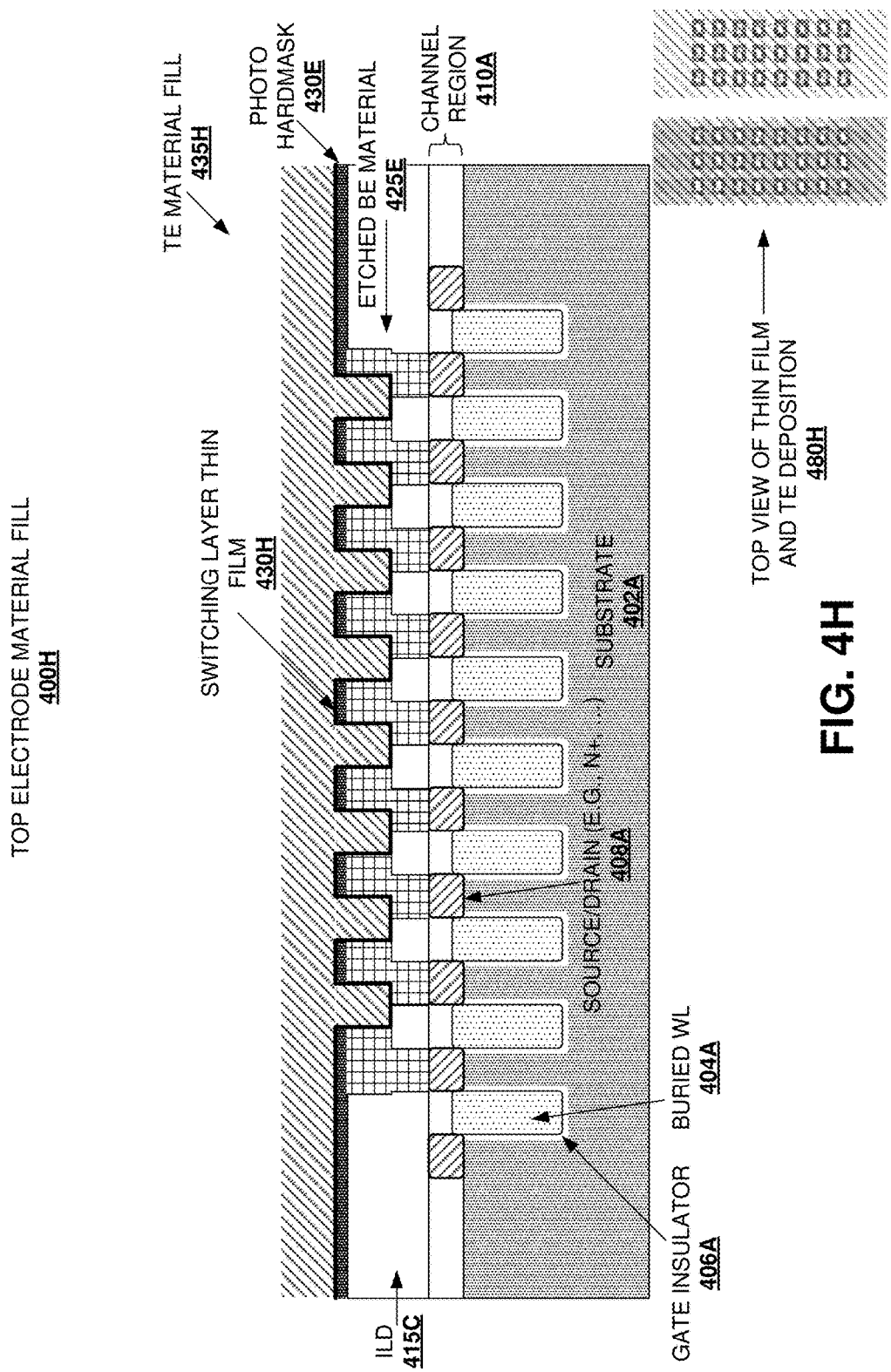
Figure 4I:
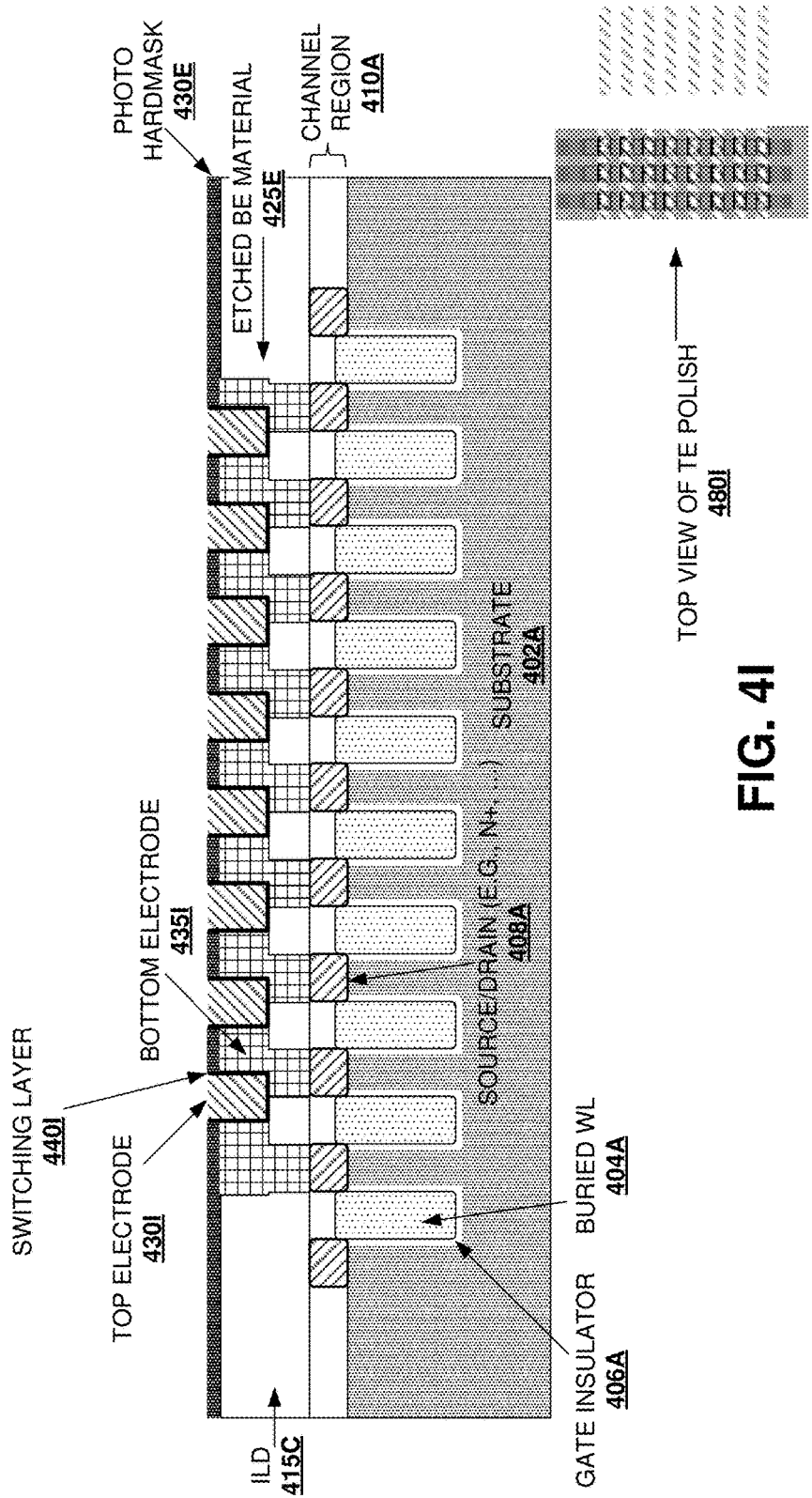
Figure 4J:
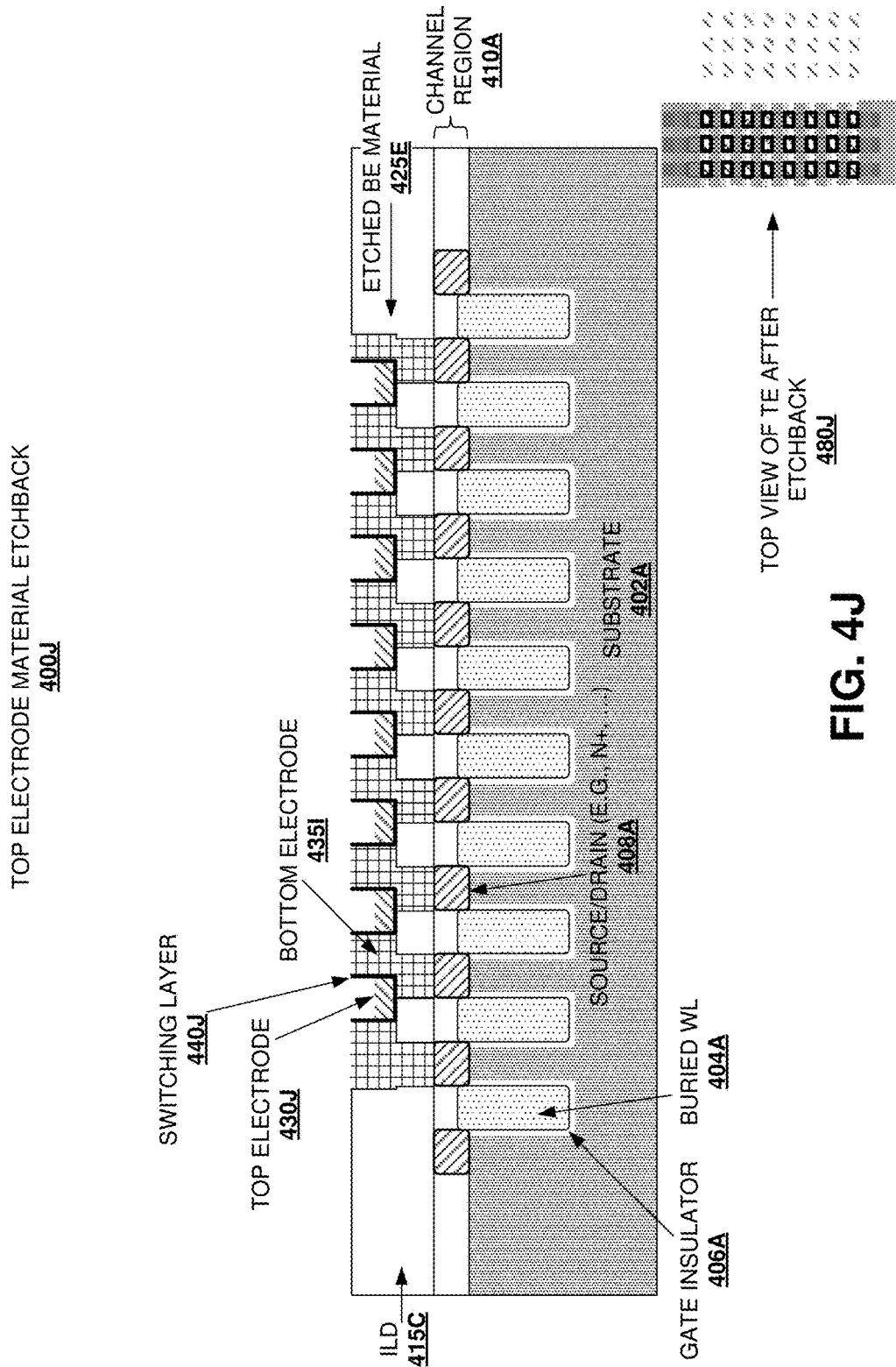
Figure 4K:
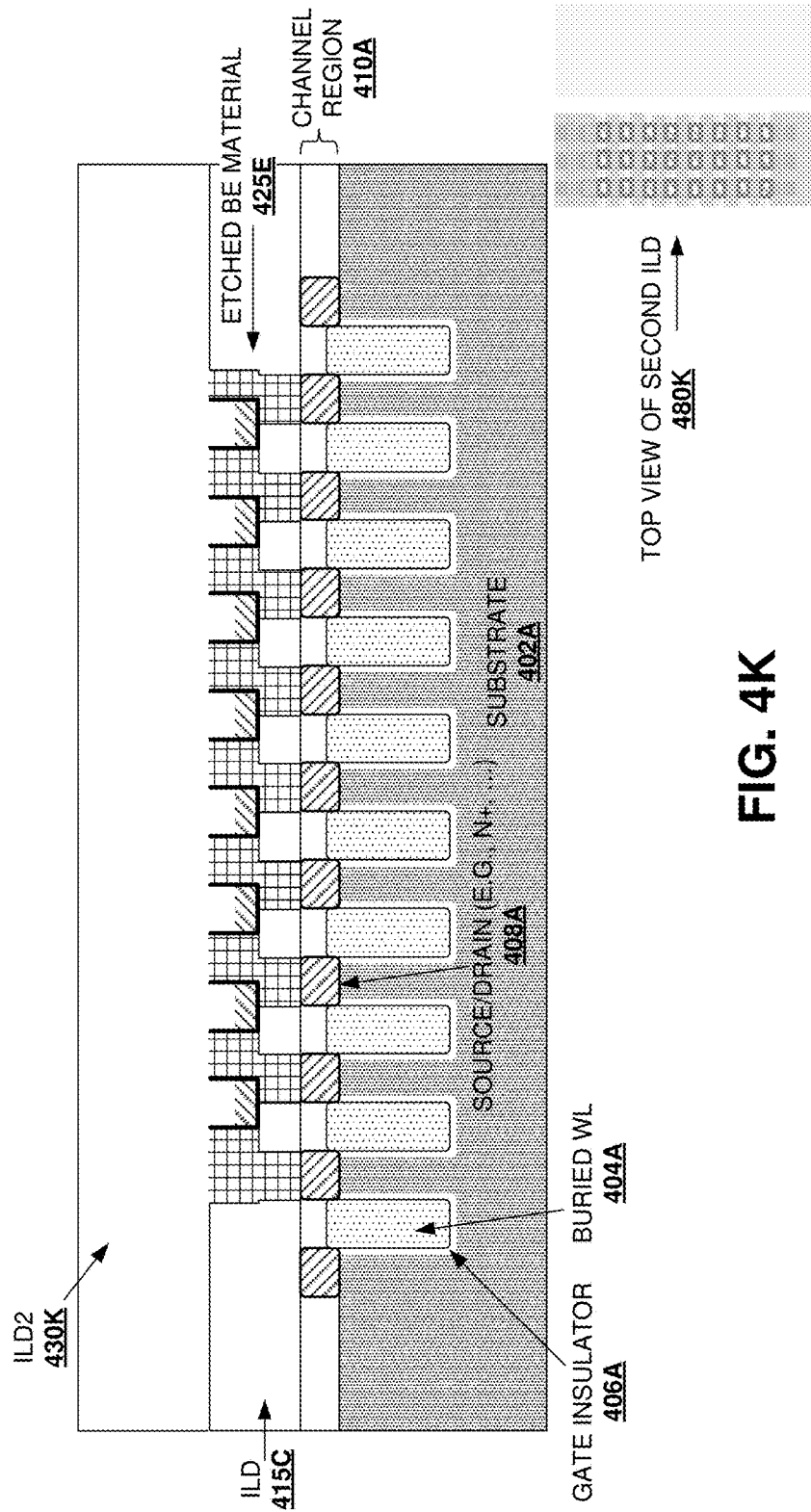
Figure 4L:
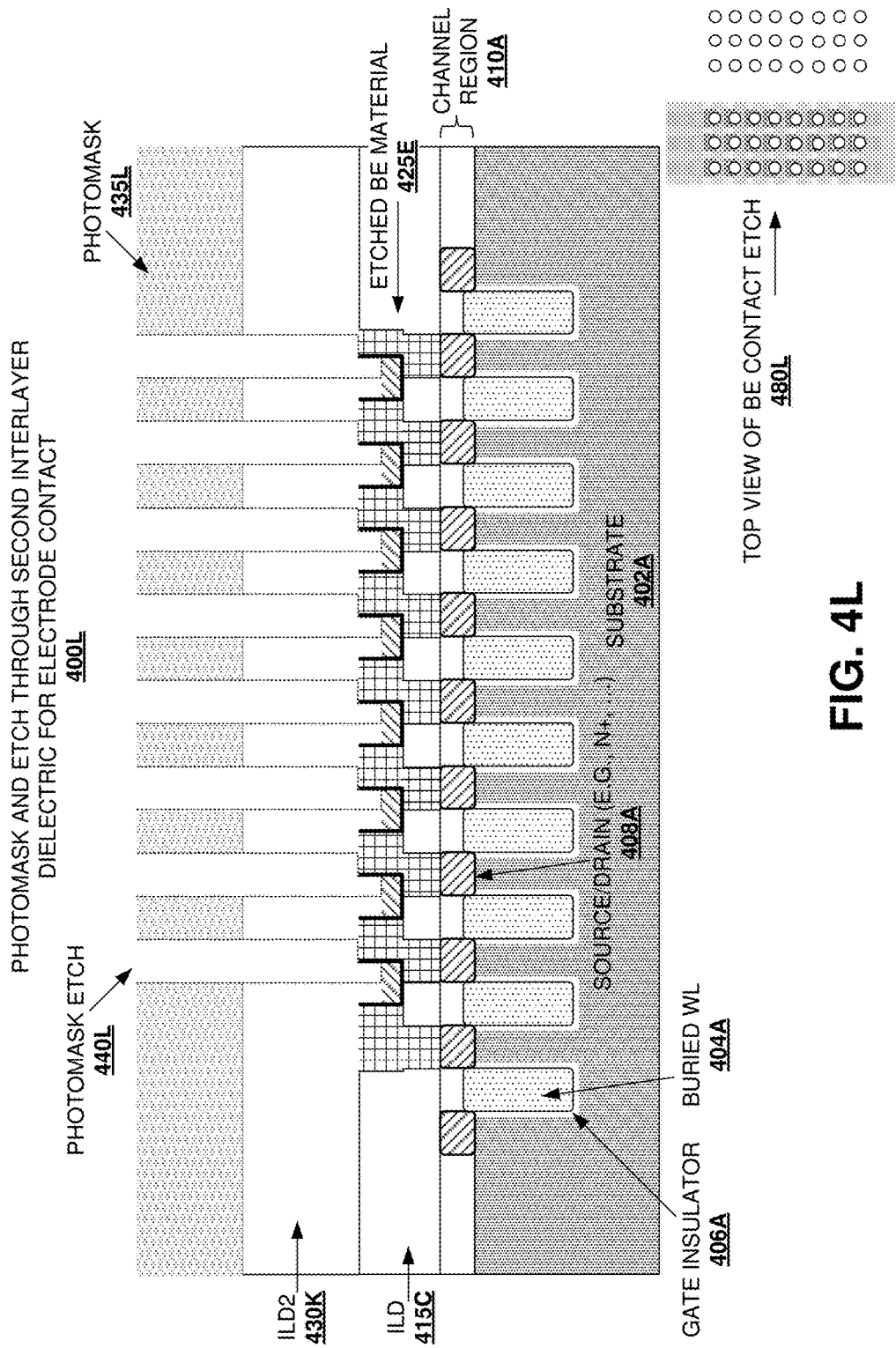
FIGS. 4L and 4M illustrate block diagrams of sample processes for fabricating an array of memory cells according to a first embodiment(s) of the disclosure.
Figure 4M:
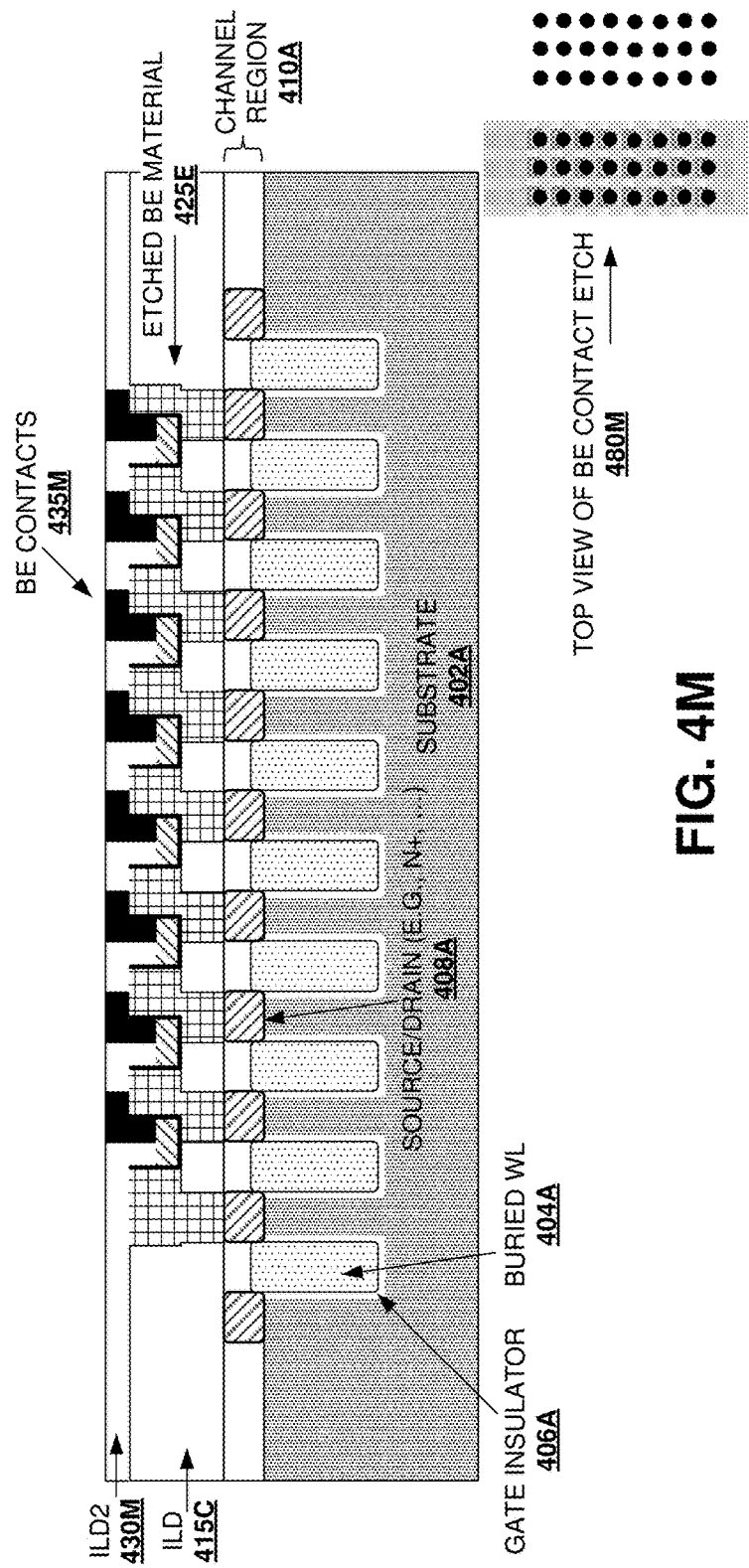
Figure 4N:
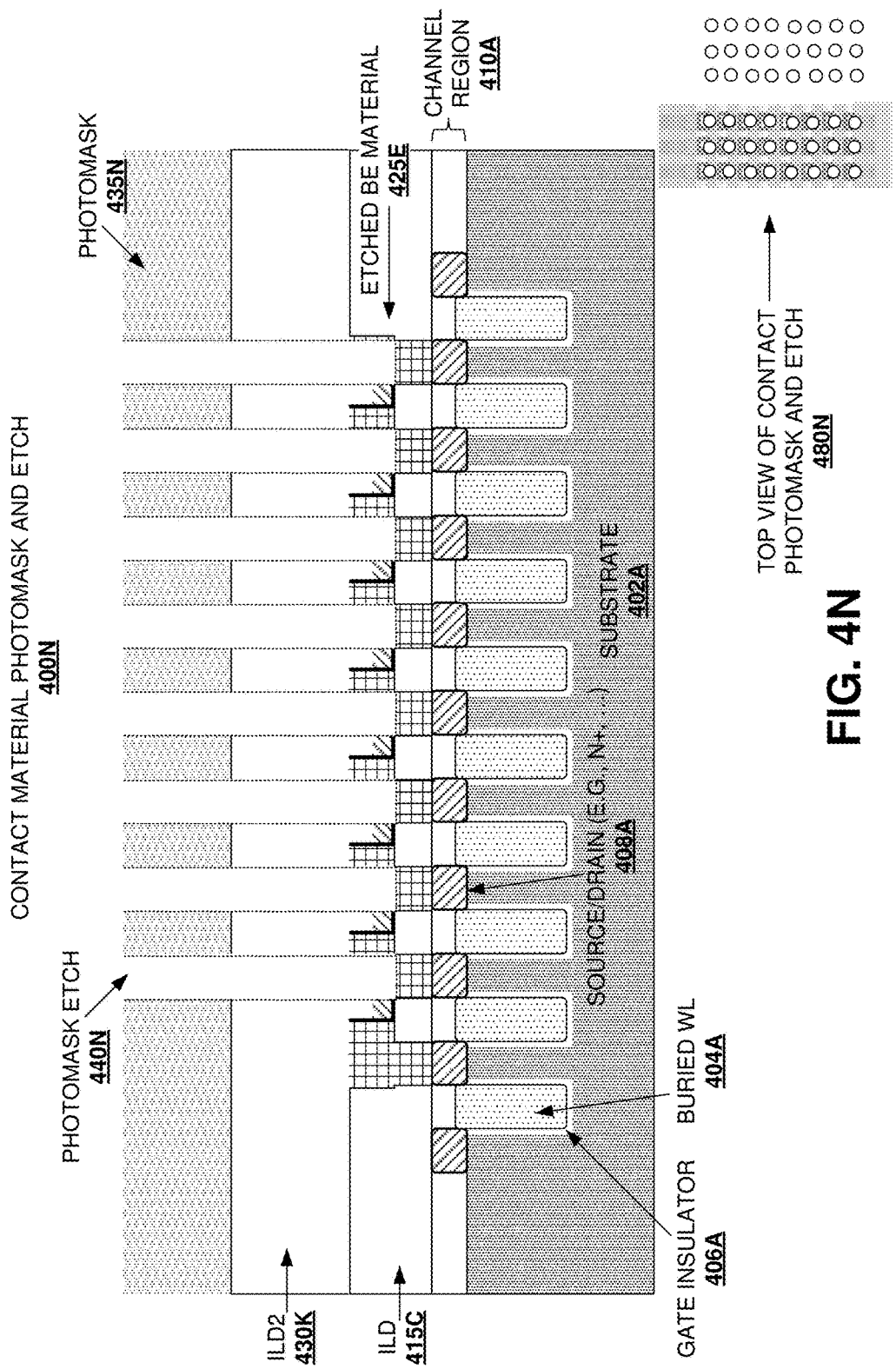
FIGS. 4N and 4O depict block diagrams of sample processes for fabricating an array of memory cells according to an alternative embodiment(s)
Figure 4O:
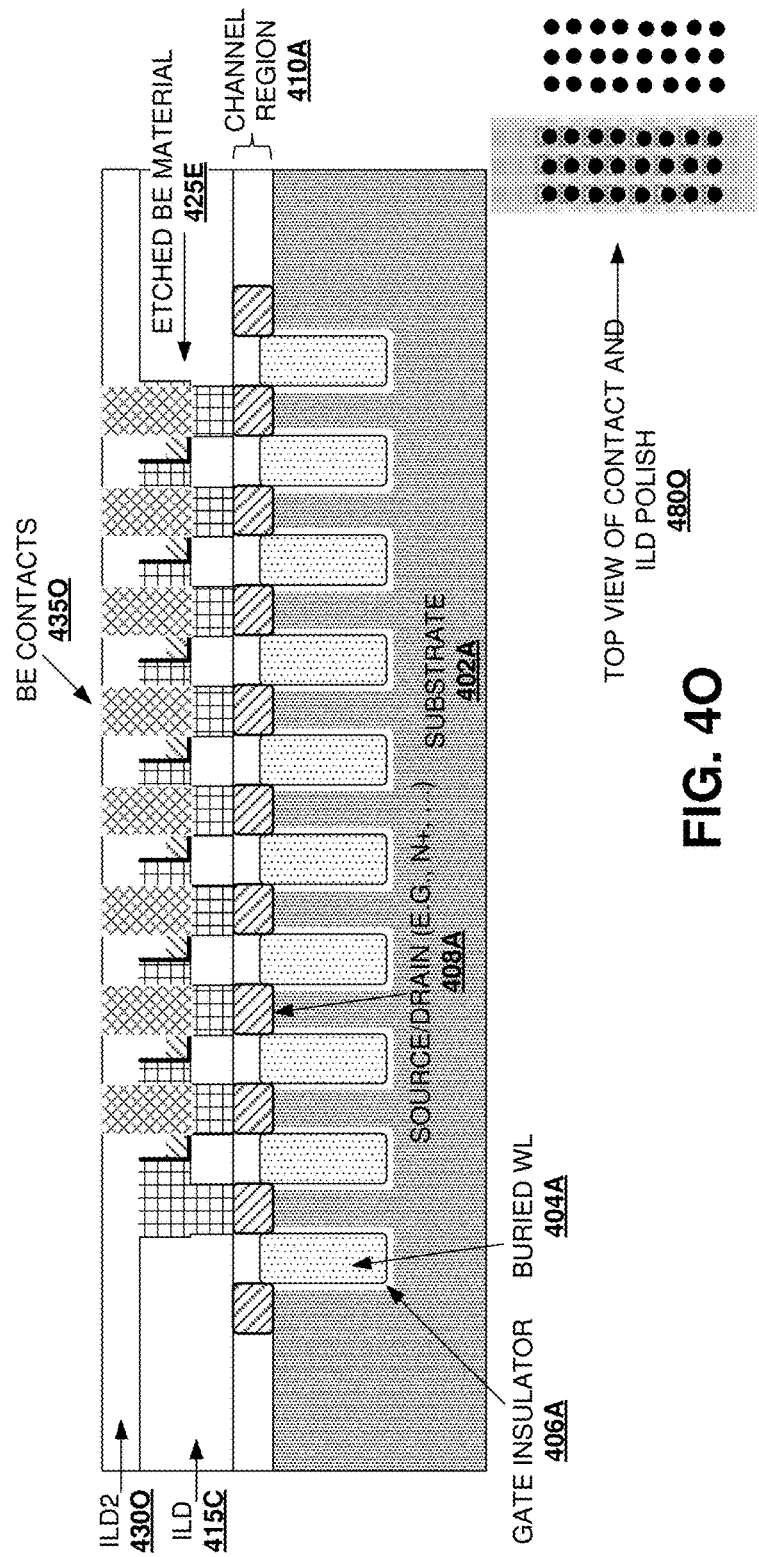
Figure 5:
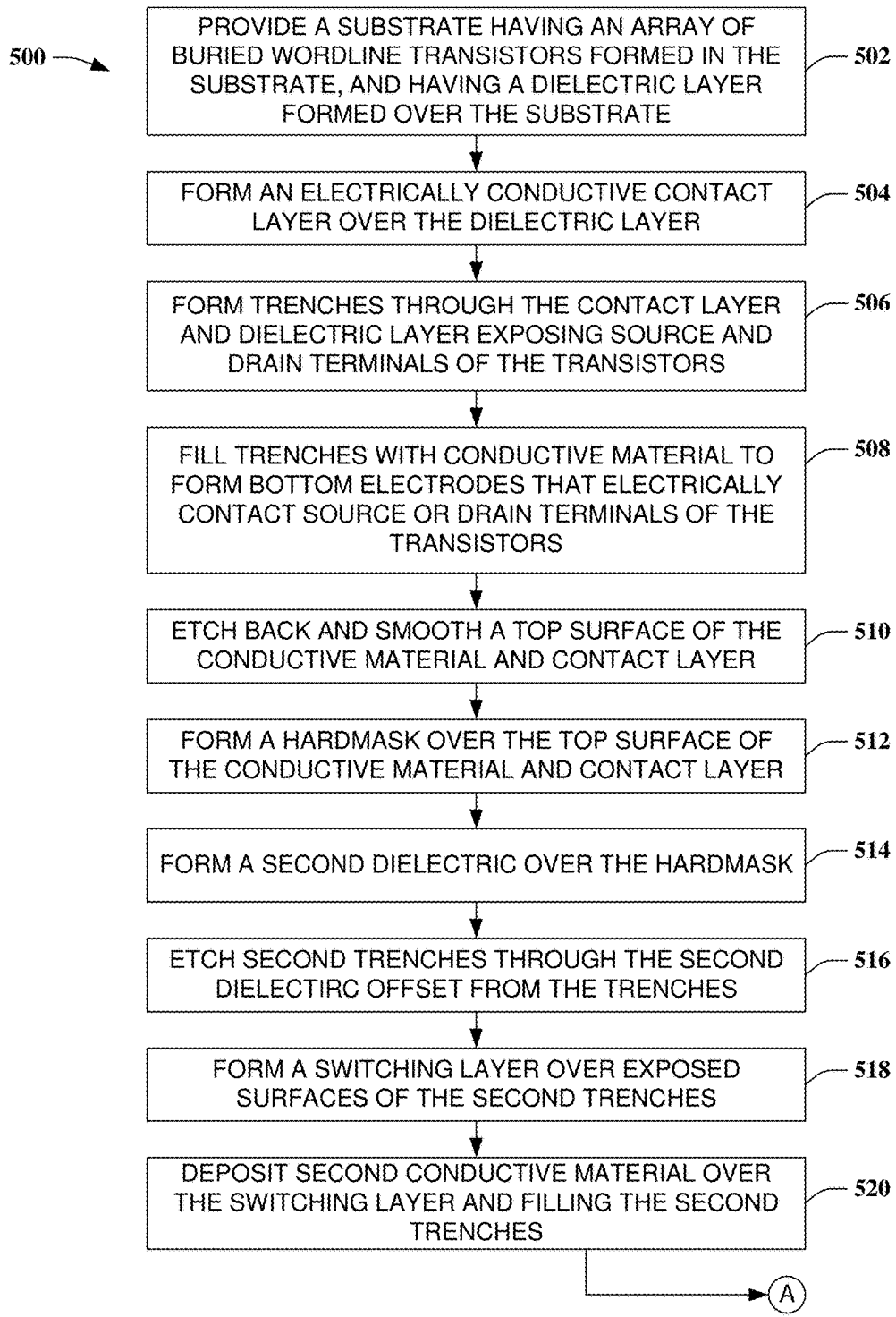
FIGS. 5 and 5A depict a flowchart of an example method of fabricating a memory device according to an embodiment of the present disclosure.
Figure 6:
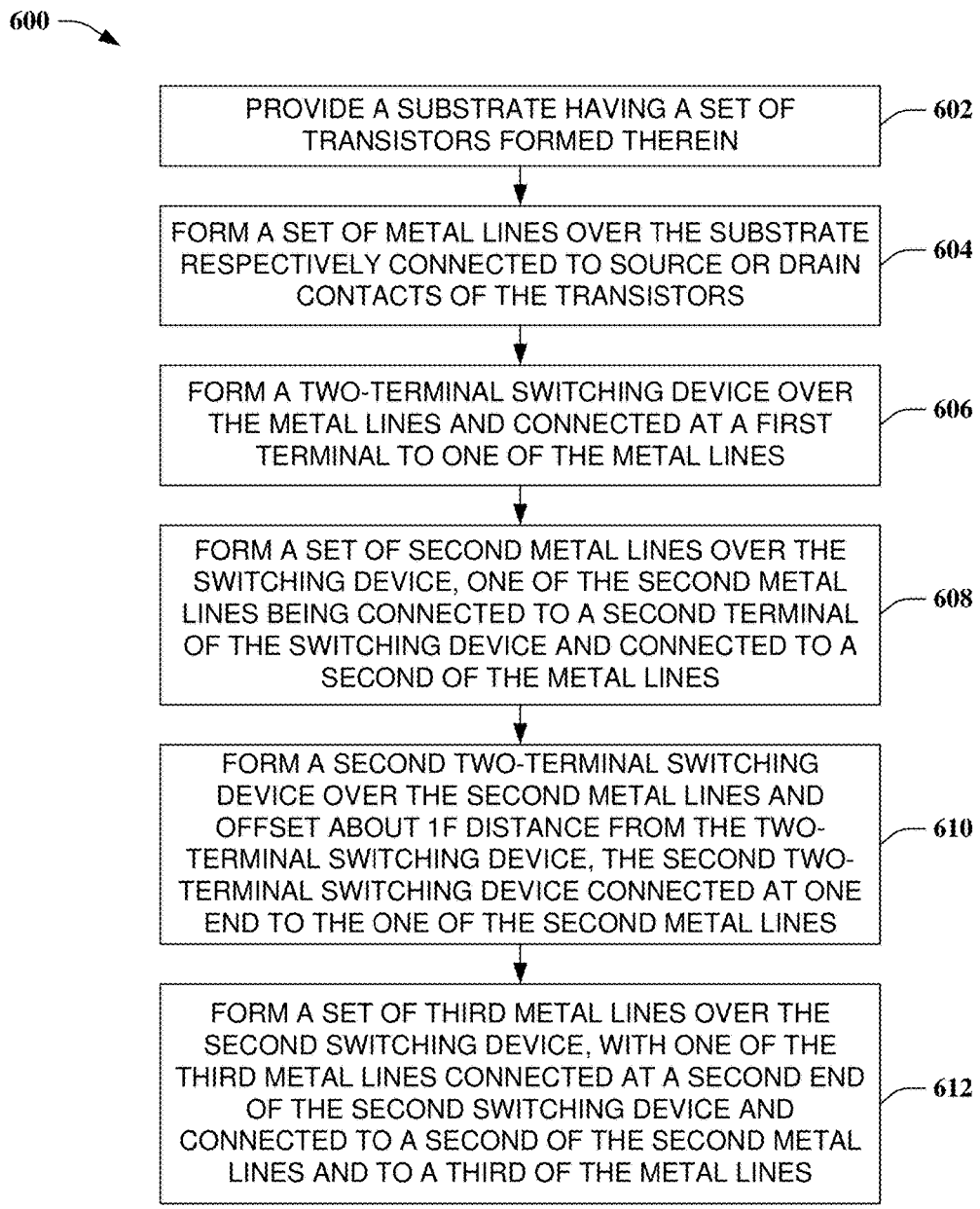
FIG. 6 illustrates a flowchart of a sample method of fabricating a memory device according to still other disclosed embodiments.

In view of the exemplary diagrams described supra, process methods that can be implemented in accordance with the disclosed subject matter will be better appreciated with reference to the block diagrams of FIGS. 4A through 4O, and to the flow charts of FIGS. 5-6. While for purposes of simplicity of explanation, the methods of FIGS. 5-6 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein, and in some embodiments additional process steps not depicted but known in the art or made known to one of ordinary skill in the art by way of the context provided herein, can be added to the depicted blocks without departing from the scope of the subject disclosure. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIGS. 4A-4O illustrate example block diagrams of processes for fabricating an array of memory cells according to various embodiments of the present disclosure. For instance, the block diagrams can be implemented to fabricate array of memory devices 301 of FIG. 3, supra, or array of memory devices 401 of FIG. 4, supra. Moreover, the subject disclosure is not limited to the depicted processes for the depicted memory devices, as other memory devices, not explicitly depicted herein but impliedly or inherently made known to one of ordinary skill in the art by way of the context provided herein are considered within the scope of the present disclosure.

Referring to FIG. 4A, a substrate 402A is illustrated for a deposition and etch of an interlayer dielectric 400A. The substrate 402A comprises buried wordlines 404A and respective gate insulator 406A trenches about the buried wordlines 404A, having source/drain regions 408A formed in a channel region 410A overlying substrate 402A. An interlayer dielectric 415A is formed over the channel region 410A. In addition, a photomask 420A is provided over the interlayer dielectric 415A, and holes are etched through photomask 420A and interlayer dielectric 415A to expose source/drain regions 408A within channel region 410A. In an embodiment, the holes etched through photomask 420A and interlayer dielectric 415A can be about $F^2$ in area (or F in width by F in height). A top view 480A of deposition and etch of the interlayer dielectric 400A is illustrated in the lower right corner of FIG. 4A.

FIG. 4B depicts a bottom electrode trench etch 400B through photomask 420B. Trench etch 425B abuts (or slightly overlaps) interlayer dielectric 415B. A top view of the trench etch and mask 480B is provided. FIG. 4C depicts a mask etchback 400C to remove photomask 420B and optionally a polish to flatten a top surface of interlayer dielectric 415C. A top view of mask etch 480C is illustrated. At FIG. 4D, a bottom electrode trench etch fill 400D is depicted. Bottom electrode (BE) material fill 425D is provided into and overlying the holes in interlayer dielectric 415C and trench etch 425B through interlayer dielectric 415C, as illustrated. A top view of trench etch fill 480D is provided at a lower right corner of FIG. 4D.

FIG. 4E illustrates a block diagram of a bottom electrode etch (or polish) to form a substantially planar (e.g., within chemical mechanical polish limits, or limits of another suitable etch or polish) top surface of etched BE material 425E with a top surface of interlayer dielectric 415C. A top view of the BE etchback 480E (or polish) is depicted to show the etched BE material 425E fills the trenches within interlayer dielectric 415C of trench etch 425B. In addition, a photo hardmask 430E can be deposited over interlayer dielectric 415C and etched BE material 425E.

FIG. 4F depicts a block diagram of a top electrode photomask etch 400F. A photomask 430F is deposited over photo hardmask 430E, which is followed by a photomask etch 435F exposing a top surface of photo hardmask 430E to holes (or trenches) of photomask etch 435F. A top view of photomask and etch 480F is provided.

FIG. 4G depicts a block diagram of bottom electrode etch through 400G. An etch through hardmask and BE 435G can be $F^2$ in area (or F in width by F in height). Moreover, the etch through hardmask and BE 435G can be offset (e.g., ½ or about ½ F, or other suitable fraction of F, such as ⅓ or about ⅓ F, ¼ or about ¼ F, . . . ) from holes etched by deposition and etch of interlayer dielectric 400A, and BE material fill 425D. Thus, the holes created by etch through hardmask and BE 435G can be offset a suitable fraction of F from etched BE material 425E, as illustrated. Additionally, etch through hardmask and BE 435G can stop on interlayer dielectric 440G. A top view of bottom electrode etch through 480G is provided.

FIG. 4H depicts a block diagram of a top electrode material fill 400H. Photomask 430F is removed, and a switching layer thin film 430H is deposited over exposed surfaces of photo hardmask 430E and etched BE material 425E. A top electrode (TE) material fill 435H is then deposited over etched BE material 425E, photo hardmask 430E, and switching layer thin film 430H. A top view of top electrode material fill 480H is provided.

FIG. 4I depicts a top electrode material chemical mechanical polish (CMP) 400I. TE material fill is polished or etched and removed to expose a top surface of photo hardmask 430E, as well as top surfaces of top electrode 430I, bottom electrode 435I and switching layer 440I. A top view of TE polish 480I is illustrated.

FIG. 4J illustrates a top electrode material etchback 400J to etchback top electrode 430J within etched BE material 425E and thin film of switching layer 440J. Photo hardmask 430E can optionally be removed as illustrated. A top view of TE after etchback 480J is depicted.

FIG. 4K depicts a block diagram of a second interlayer dielectric deposition and polish 400K, producing ILD2 430K above etched back top electrodes 430J within etched BE material 425E. A top view of second ILD 480K is provided.

FIGS. 4L and 4M depict block diagrams of processes for fabricating a memory array according to one or more disclosed embodiments. For example, the processes of FIGS. 4L and 4M can be implemented to produce array of memory devices 401 of FIG. 4, supra. FIG. 4L illustrates a photomask and etch through of second interlayer dielectric for electrode contact 400L. A photomask 435L over ILD2 430K is provided, and photomask etch 440L through photomask and ILD2 430K is illustrated. Holes of photomask etch 440L can be $F^2$ in area (e.g., F in width by F in length), and can be offset a fraction of F (e.g., ½ or about ½ F, ¼ or about ¼ F, etc.) relative to top electrodes 430J and trenches of etched BE material 425E. Photomask etch 440L can stop on top electrodes 430J and on etched BE material 425E, as illustrated. A top view of BE contact etch 480L is provided. FIG. 4M illustrates a contact material deposition and polish 400M. BE contacts 435M are formed by deposition of BE contact material into photomask etch 440L holes in interlayer dielectric 430K. A polish or etchback is conducted to remove ILD2 430K and BE contact material within ILD2 430K to form an ILD2 430K surface substantially planar (e.g., within limits of CMP or etchback techniques, or other techniques) with top surfaces of BE contacts 435M.

FIGS. 4N and 4O depict block diagrams of processes for fabricating a memory array according to alternative disclosed embodiments. The processes of FIGS. 4N and 4O can be implemented to produce array of memory devices 301 of FIG. 3, supra. FIG. 4N depicts a contact material photomask and etch 400N. A photomask 435N is provided above ILD2 430K, and photomask etch 440N is implemented through photomask 435N and ILD2 430K. Photomask etch 440N can etch through a portion of etched BE material 425E, a portion of top electrodes 430J and switching layer 440J. After etching through the portion of top electrodes 430J and switching layer 440J, photomask etch 440N can stop. The stop can be implemented after the portion of switching layer 440J is removed, in an embodiment. In further embodiments, the stop can be implemented upon detecting bottom electrode material of etched BE material 425E following removal of the portion of switching layer 440J. As illustrated, photomask etch 440N can overly or substantially overlay the holes of deposition and etch of interlayer dielectric 400A of FIG. 4A, and BE material fill 425D within holes created by the deposition and etch of interlayer dielectric 400A. A top view of contact photomask and etch 480N is provided.

FIG. 4O depicts a contact material deposition and polish 400O. BE contact material fill is provided within holes through interlayer dielectric 400A. A polish or etchback of ILD2 430O and BE contact material fill results in BE contacts 435O substantially planar with a top surface of ILD2 430O. A top view of contact and ILD polish 480O is illustrated.

Figure 5A:
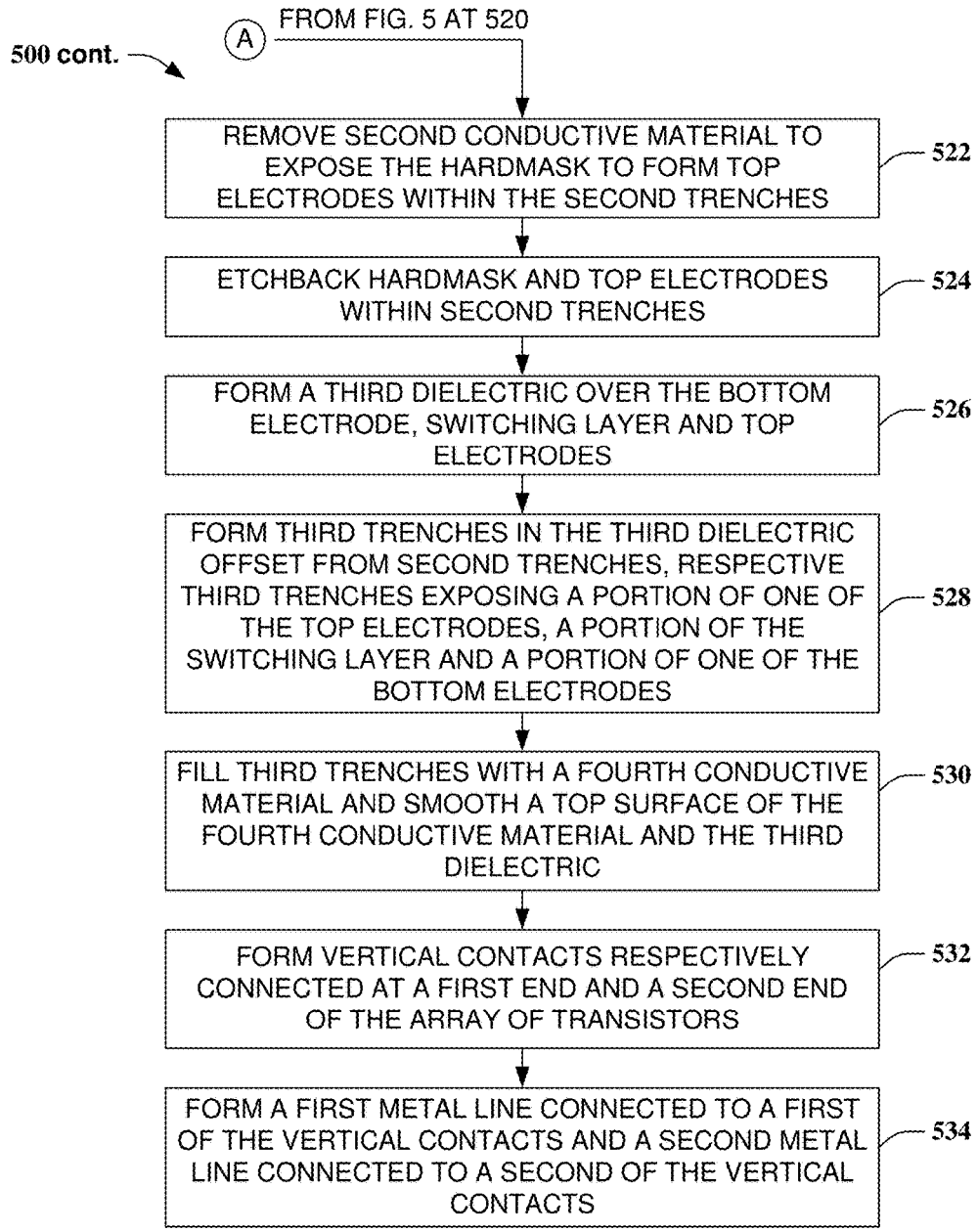

Referring to FIGS. 5 and 5A, there is illustrated a method 500 for fabricating a memory device. At 502, method 500 can comprise providing a substrate having an array of buried wordline transistors formed in the substrate, and having a dielectric layer formed over the substrate and the transistors. At 504, method 500 can comprise forming an electrically conductive contact layer over the dielectric layer, and at 506, method 500 can comprise forming trenches through the electrically conductive contact layer and the dielectric layer. In various embodiments, the respective trenches can expose source and drain terminals of the transistors. At 508, method 500 can comprise filling the trenches with conductive material to form bottom electrodes for the memory device. The conductive material can be electrically in contact with the source and drain terminals of the transistors, in one or more embodiments.

At 510, method 500 can comprise etching back or smoothing a top surface of the conductive material and the electrically conductive contact layer. In an embodiment, top surfaces of the conductive material and the electrically conductive contact layer can be substantially coplanar following the etching back or smoothing. At 512, method 500 can comprise forming a hardmask over the top surface of the conductive material and the electrically conductive contact layer. At 514, method 500 can comprise forming a second dielectric over the hardmask.

At 516, method 500 can comprise etching second trenches through the second dielectric. In at least some disclosed embodiments, the second trenches can be at least in part offset in orientation (e.g., offset in a depth dimension of the memory device, offset in a lateral dimension of the memory device, etc.) from the trenches and the bottom electrodes. At 518, method 500 can comprise forming a switching layer over exposed surfaces of the second trenches (e.g., exposed in response to the etching second trenches). At 520, method 500 can comprise depositing second conductive material over the switching layer and filling the second trenches.

Referring to FIG. 5A, method 500 can continue at 522, where method 500 can comprise removing second conductive material and stopping on the hardmask to expose the hardmask, and to form top electrodes within the second trenches. At 524, method 500 can comprise etching back the hardmask and top electrodes within the second trenches. At 526, method 500 can comprise forming a third dielectric over the bottom electrode, switching layer and the top electrodes. At 528, method 500 can comprise forming third trenches in the third dielectric at least in part offset from the second trenches and top electrodes. In an embodiment, the third trenches expose a portion of one of the top electrodes, a portion of the switching layer and a portion of one of the bottom electrodes. In a further embodiment, the third trenches can be offset a first distance from the second trenches, and offset a second distance from the first trenches. In some embodiments, the first distance and the second distance can be equivalent or approximately equivalent in magnitude, whereas in other embodiments the first and second distances can have different magnitudes. In one embodiment, the first distance can be approximately zero (e.g., the third trenches are aligned with the first trenches). At 530, method 500 can comprise filling the third trenches with a fourth conductive material, and etching or smoothing a top surface of the fourth conductive material and the third dielectric. At 532, method 500 can comprise forming vertical contacts respectively connected at a first end and at a second end of the array of transistors. At 534, method 500 can comprise forming a first metal line connected to a first of the vertical contacts and a second metal line connected to a second of the vertical contacts.

FIG. 6 illustrates a flowchart of a sample method 600 for fabricating a memory device according to further embodiments of the subject disclosure. At 602, method 600 can comprise providing a substrate having a set of transistors formed therein. In an embodiment, the transistors can be buried wordline transistors. In a further embodiment, the transistors can be deep trench buried wordline transistors. At 604, method 600 can comprise forming a set of metal lines over the substrate respectively connected to source or drain contacts of the transistors. At 606, method 600 can comprise forming a two-terminal switching device over the metal lines and connected at a first terminal to one of the metal lines. In addition to the foregoing, at 608, method 600 can comprise forming a set of second metal lines over the switching device, one of the second metal lines being connected to a second terminal of the switching device and connected to a second of the metal lines. At 610, method 600 can comprise forming a second two-terminal switching device over the second metal lines and offset about 1F distance from the two-terminal switching device, the second two-terminal switching device connected at one end to the one of the second metal lines. At 612, method 600 can comprise forming a set of third metal lines over the second switching device, with one of the third metal lines connected at a second end of the second of the second switching device and connected to a second of the second metal lines and to a third of the metal lines.

Example Operating Environments

Figure 7:
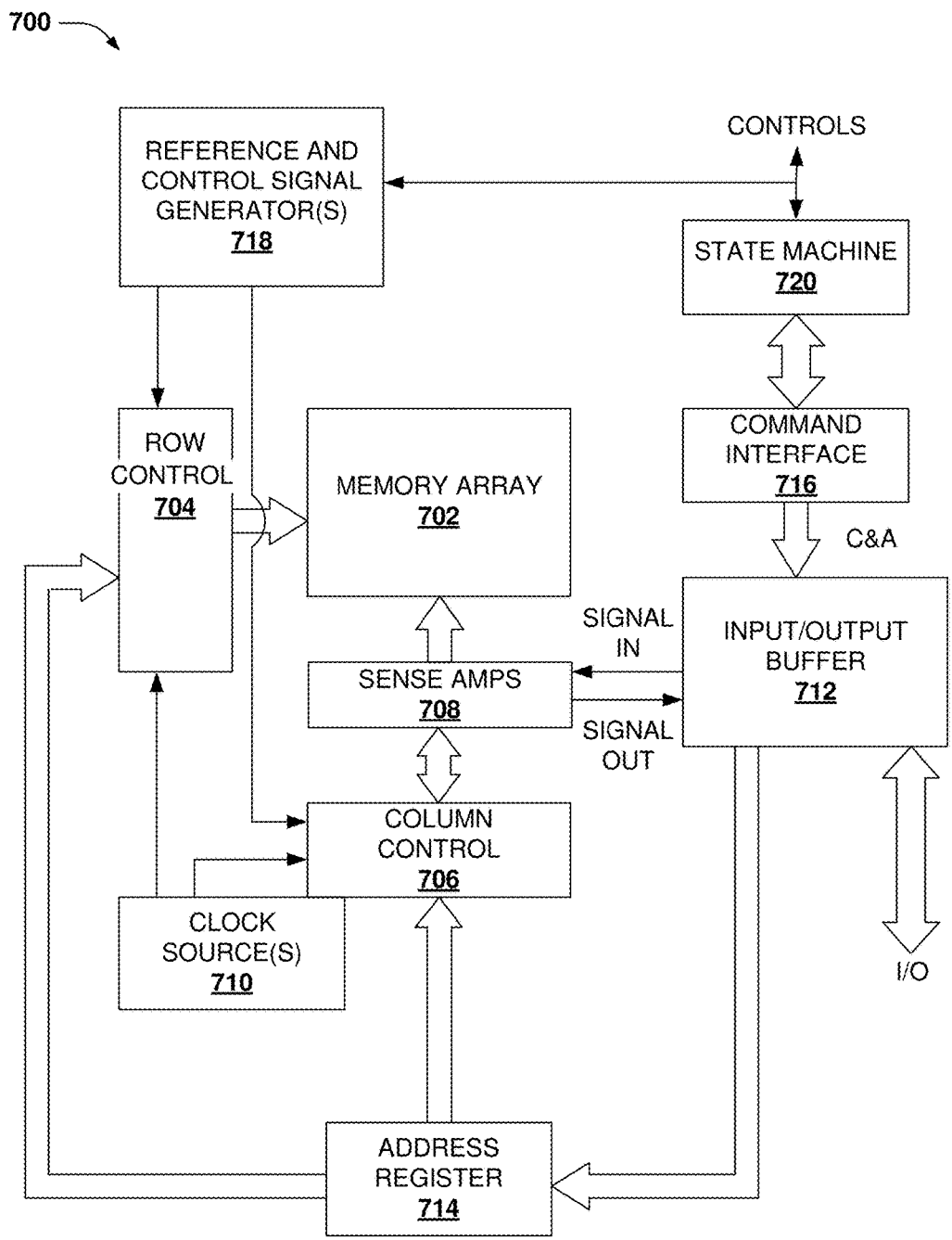
FIG. 7 illustrates a block diagram of a sample operating and control environment for a memory device according to various disclosed embodiments.

In order to provide a context for the various aspects of the disclosed subject matter, FIG. 7, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 7 illustrates a block diagram of an example operating and control environment 700 for a memory array 702 of a multi-bank memory cell array according to aspects of the subject disclosure. In at least one aspect of the subject disclosure, memory array 702 can comprise memory selected from a variety of memory cell technologies. In at least one embodiment, memory array 702 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory array 702 can be configured to operate according to a read operation as provided herein.

A column controller 706 and sense amps 708 can be formed adjacent to memory array 702. Moreover, column controller 706 can be configured to activate (or identify for activation) a subset of bitlines of memory array 702. Column controller 706 can utilize a control signal provided by a reference and control signal generator(s) 718 to activate, as well as operate upon, respective ones of the subset of bitlines, applying suitable program, erase or read voltages to those bitlines. Non-activated bitlines can be kept at an inhibit voltage (also applied by reference and control signal generator(s) 718), to mitigate or avoid bit-disturb effects on these non-activated bitlines.

In addition, operating and control environment 700 can comprise a row controller 704. Row controller 704 can be formed adjacent to and electrically connected with word lines of memory array 702. Further, utilizing control signals of reference and control signal generator(s) 718, row controller 704 can select particular rows of memory cells with a suitable selection voltage. Moreover, row controller 704 can facilitate program, erase or read operations by applying suitable voltages at selected word lines.

Sense amps 708 can read data from, or write data to the activated memory cells of memory array 702, which are selected by column control 706 and row control 704. Data read out from memory array 702 can be provided to an input and input/output buffer 712 (e.g., an LPDDR buffer, in some embodiments). Likewise, data to be written to memory array 702 can be received from the input and input/output buffer 712 and written to the activated memory cells of memory array 702.

A clock source(s) 710 can provide respective clock pulses to facilitate timing for read, write, and program operations of row controller 704 and column controller 706. Clock source(s) 710 can further facilitate selection of wordlines or bitlines in response to external or internal commands received by operating and control environment 700. Input and input/output buffer 712 can comprise a command and address input, as well as a bidirectional data input and output. Instructions are provided over the command and address input, and the data to be written to memory array 702 as well as data read from memory array 702 is conveyed on the bidirectional data input and output, facilitating connection to an external host apparatus, such as a computer or other processing device (not depicted, but see e.g., computer 802 of FIG. 8, infra).

Input and input/output buffer 712 can be configured to receive write data, receive an erase instruction, receive a status or maintenance instruction, output readout data, output status information, and receive address data and command data, as well as address data for respective instructions. Address data can be transferred to row controller 704 and column controller 706 by an address register 710. In addition, input data is transmitted to memory array 702 via signal input lines between sense amps 708 and input and input/output buffer 712, and output data is received from memory array 702 via signal output lines from sense amps 708 to input and input/output buffer 712. Input data can be received from the host apparatus, and output data can be delivered to the host apparatus via the I/O bus.

Commands received from the host apparatus can be provided to a command interface 716. Command interface 716 can be configured to receive external control signals from the host apparatus, and determine whether data input to the input and input/output buffer 712 is write data, a command, or an address. Input commands can be transferred to a state machine 720.

State machine 720 can be configured to manage programming and reprogramming of memory array 702 (as well as other memory banks of the multi-bank memory array). Instructions provided to state machine 720 are implemented according to control logic configurations, enabling state machine 720 to manage read, write, erase, data input, data output, and other functionality associated with memory array 702. In some aspects, state machine 720 can send and receive acknowledgments and negative acknowledgments regarding successful receipt or execution of various commands. In further embodiments, state machine 720 can decode and implement status-related commands, decode and implement configuration commands, and so on.

To implement read, write, erase, input, output, etc., functionality, state machine 720 can control clock source(s) 708 or reference and control signal generator(s) 718. Control of clock source(s) 708 can cause output pulses configured to facilitate row controller 704 and column controller 706 implementing the particular functionality. Output pulses can be transferred to selected bitlines by column controller 706, for instance, or wordlines by row controller 704, for instance.

Figure 8:
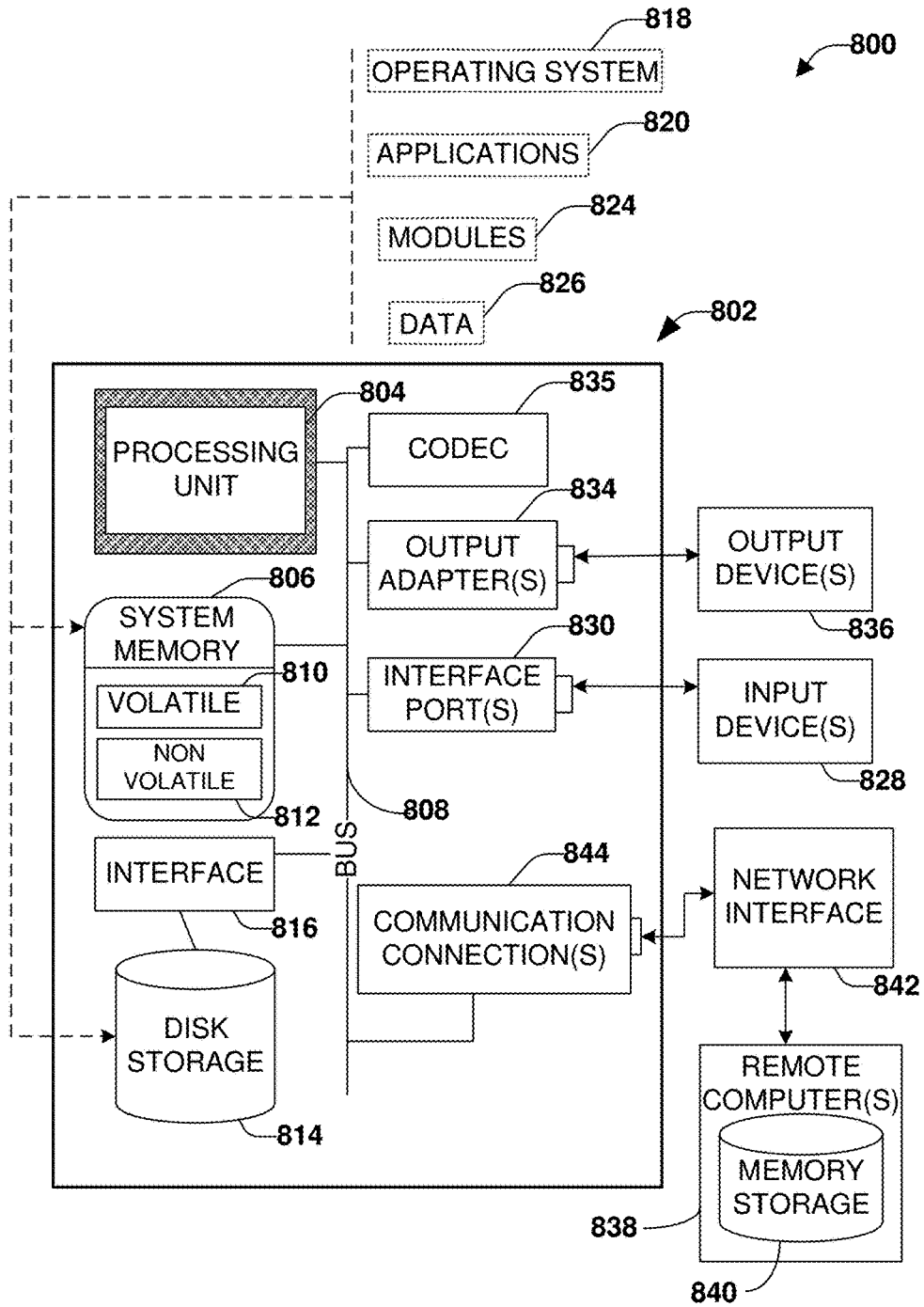
FIG. 8 illustrates a block diagram of an example computing environment that can be implemented in conjunction with various embodiments.

With reference to FIG. 8, a suitable environment 800 for implementing various aspects of the claimed subject matter includes a computer 802. The computer 802 includes a processing unit 804, a system memory 806, a codec 835, and a system bus 808. The system bus 808 couples system components including, but not limited to, the system memory 806 to the processing unit 804. The processing unit 804 can be any of various available processors. Dual microprocessors and other multiprocessor architectures also can be employed as the processing unit 804.

The system bus 808 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 806 includes volatile memory 810 and non-volatile memory 812. The basic input/output system (BIOS), containing the basic routines to transfer information between elements within the computer 802, such as during start-up, is stored in non-volatile memory 812. In addition, according to present innovations, codec 835 may include at least one of an encoder or decoder, wherein the at least one of an encoder or decoder may consist of hardware, software, or a combination of hardware and software. Although, codec 835 is depicted as a separate component, codec 835 may be contained within non-volatile memory 812. By way of illustration, and not limitation, non-volatile memory 812 can include read only memory (ROM), programmable ROM (PROM), electrically programmable ROM (EPROM), electrically erasable programmable ROM (EEPROM), or flash memory. Volatile memory 810 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 802 may also include removable/non-removable, volatile/non-volatile computer storage medium. FIG. 8 illustrates, for example, disk storage 814. Disk storage 814 includes, but is not limited to, devices like a magnetic disk drive, solid state disk (SSD) floppy disk drive, tape drive, Jaz drive, Zip drive, LS-100 drive, flash memory card, or memory stick. In addition, disk storage 814 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 814 to the system bus 808, a removable or non-removable interface is typically used, such as interface 816. It is appreciated that storage devices 814 can store information related to a user. Such information might be stored at or provided to a server or to an application running on a user device. In one embodiment, the user can be notified (e.g., by way of output device(s) 836) of the types of information that are stored to disk storage 814 and/or transmitted to the server or application. The user can be provided the opportunity to opt-in or opt-out of having such information collected and/or shared with the server or application (e.g., by way of input from input device(s) 828).

It is to be appreciated that FIG. 8 describes software that acts as an intermediary between users and the basic computer resources described in the suitable operating environment 800. Such software includes an operating system 818. Operating system 818, which can be stored on disk storage 814, acts to control and allocate resources of the computer system 802. Applications 820 take advantage of the management of resources by operating system 818 through program modules 824, and program data 826, such as the boot/shutdown transaction table and the like, stored either in system memory 806 or on disk storage 814. It is to be appreciated that the claimed subject matter can be implemented with various operating systems or combinations of operating systems.

A user enters commands or information into the computer 802 through input device(s) 828. Input devices 828 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 804 through the system bus 808 via interface port(s) 830. Interface port(s) 830 include, for example, a serial port, a parallel port, a game port, and a universal serial bus (USB). Output device(s) 836 use some of the same type of ports as input device(s) 828. Thus, for example, a USB port may be used to provide input to computer 802 and to output information from computer 802 to an output device 836. Output adapter 834 is provided to illustrate that there are some output devices 836 like monitors, speakers, and printers, among other output devices 836, which require special adapters. The output adapters 834 include, by way of illustration and not limitation, video and sound cards that provide a means of connection between the output device 836 and the system bus 808. It should be noted that other devices and/or systems of devices provide both input and output capabilities such as remote computer(s) 838.

Computer 802 can operate in a networked environment using logical connections to one or more remote computers, such as remote computer(s) 838. The remote computer(s) 838 can be a personal computer, a server, a router, a network PC, a workstation, a microprocessor based appliance, a peer device, a smart phone, a tablet, or other network node, and typically includes many of the elements described relative to computer 802. For purposes of brevity, only a memory storage device 840 is illustrated with remote computer(s) 838. Remote computer(s) 838 is logically connected to computer 802 through a network interface 842 and then connected via communication connection(s) 844. Network interface 842 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 844 refers to the hardware/software employed to connect the network interface 842 to the bus 808. While communication connection 844 is shown for illustrative clarity inside computer 802, it can also be external to computer 802. The hardware/software necessary for connection to the network interface 842 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for fabricating a memory device, comprising:
providing a substrate having a set of transistors formed in the substrate;
forming a set of metal lines over the substrate respectively connected to source or drain contacts of the transistors; and
forming a two-terminal switching device over the metal lines and connected at a first terminal to one of the metal lines and electrically connected at a second terminal to a second of the metal lines, thereby connecting the two-terminal switching device electrically in parallel with a transistor of the set of transistors; wherein the two-terminal switching device and the transistor form a 1T-1R memory cell that has a projected area on the substrate approximately equal to $4F^2$.

2. The method of claim 1, further comprising forming a second set of metal lines over the two-terminal switching device, wherein one of the second set of metal lines is connected to and provides electrical protection between the second terminal of the two-terminal switching device and the second of the metal lines.

3. The method of claim 2, further comprising forming a second two-terminal switching device over the second set of metal lines and offset about 1F distance from the two-terminal switching device.

4. The method of claim 3, further comprising electrically connecting the second two-terminal switching device at a first end thereof to the second terminal of the two-terminal switching device and the one of the second set of metal lines.

5. The method of claim 4, further comprising forming a set of third metal lines over the second switching device, connecting one of the third metal lines at a second end of the second two-terminal switching device, and electrically connecting the one of the third metal lines to a second of the second set of metal lines and to a third of the set of metal lines.

6. The method of claim 1, further comprising electrically connecting a second two-terminal switching device in parallel to a second transistor of the set of transistors formed in the substrate thereby forming a second 1T-1R memory cell that has a second projected area approximately equal to $4F^2$ and that is adjacent to the projected area.

7. The method of claim 1, further comprising:
forming the two-terminal switching device as one of an array of two-terminal switching devices; and
forming a select transistor at a first end of the array of two-terminal switching devices, the select transistor configured to electrically connect or electrically isolate the array of two-terminal switching devices to or from a sourceline of the memory device.

8. The method of claim 7, further comprising forming a second select transistor at a second end of the array of two-terminal switching devices, the second select transistor configured to electrically connect or electrically isolate the array of two-terminal switching devices to or from a bitline of the memory device.

9. The method of claim 7, further comprising at least one of:
forming the array of two-terminal switching devices among a single array of conductive lines of the memory device; or
forming the array of two-terminal switching devices among multiple stacked conductive lines of the memory device.

10. A memory device, comprising:
a substrate comprising an array of transistors;
an array of two-terminal memory devices overlying the array of transistors, wherein respective two-terminal memory devices are connected electrically in parallel with respective transistors to form respective one resistor-one transistor memory devices, the array of transistors and the array of two-terminal memory devices forming a memory device array comprising the one resistor-one transistor memory devices;
a first select transistor configured to connect or disconnect a first end of the memory device array to a sourceline; and
a second select transistor configured to connect or disconnect a second end of the memory device array to a bitline, wherein respective one resistor-one transistor memory devices of the memory device array are each about $4F^2$ in area.

11. The memory device of claim 10, wherein the array of two-terminal memory devices includes a two-terminal memory cell comprising a bottom electrode, a switching layer and a top electrode.

12. The memory device of claim 11, wherein the bottom electrode, switching layer and top electrode are layered in a direction approximately normal to a top surface of the substrate.

13. The memory device of claim 12, wherein the two-terminal memory cell is formed between a pair of back-end-of-line (BEOL) metal layers of the memory device, and wherein a second two-terminal memory cell of the array of two-terminal memory devices is formed between a second pair of BEOL metal layers of the memory device.

14. The memory device of claim 13, wherein at least two of the array of two-terminal memory devices are formed between the pair of BEOL metal layers.

15. The memory device of claim 14, wherein at least two additional of the array of two-terminal memory devices are formed between the second pair of BEOL metal layers.

16. The memory device of claim 11, wherein the bottom electrode, switching layer and top electrode are layered in a direction approximately parallel to a top surface of the substrate.

17. The memory device of claim 16, wherein the bottom electrode, switching layer and top electrode are thin films that combine to a thickness equal to about 1F in length.

18. The memory device of claim 16, further comprising a set of conductive lines respectively connected to source or drain contacts of the array of transistors.

19. The memory device of claim 18, wherein the bottom electrode, switching layer and top electrode of the two-terminal memory cell are positioned between a first of the set of conductive lines and a second of the set of conductive lines.

20. The memory device of claim 18, wherein the bottom electrode, switching layer and top electrode of the two-terminal memory cell are offset in position with respect to vertical edges of the set of conductive lines.

* * * * *